(12) United States Patent
Oh et al.

(10) Patent No.: US 11,296,305 B2
(45) Date of Patent: Apr. 5, 2022

(54) FOLDABLE DISPLAY DEVICE INCLUDING RETARDER

(71) Applicant: Samsung Display Co., Ltd., Yongin-si (KR)

(72) Inventors: Minju Oh, Suwon-si (KR); Heeyoung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/539,567

(22) Filed: Aug. 13, 2019

(65) Prior Publication Data

US 2020/0075895 A1 Mar. 5, 2020
US 2022/0052299 A9 Feb. 17, 2022

(30) Foreign Application Priority Data

Aug. 30, 2018 (KR) .......... 10-2018-0102510

(51) Int. Cl.
*G06F 3/041* (2006.01)
*H01L 51/52* (2006.01)
(Continued)

(52) U.S. Cl.
CPC ........ *H01L 51/5281* (2013.01); *G02B 5/3016* (2013.01); *G06F 3/047* (2013.01);
(Continued)

(58) Field of Classification Search
CPC .................. G06F 3/047; G06F 3/0412; G06F 2203/04102; G06F 1/1616; G06F 1/1641;
(Continued)

(56) References Cited

U.S. PATENT DOCUMENTS 8,952,600 B2 2/2015 Ren et al.
9,645,438 B2 5/2017 Sekiguchi et al.
(Continued)

FOREIGN PATENT DOCUMENTS

JP 2017107177 6/2017
KR 10-1615460 4/2016
(Continued)

OTHER PUBLICATIONS

Extended European Search Report dated Jan. 27, 2020, issued in the European Patent Application No. 19194251.5.

*Primary Examiner* — Adam J Snyder
(74) *Attorney, Agent, or Firm* — H.C. Park & Associates, PLC

(57) ABSTRACT

A foldable display device including: a display panel; an input sensor directly disposed on the display panel and having an upper surface; an anti-reflector disposed on the upper surface of the input sensor, the anti-reflector including: a polarizer; and at least one lower retarder disposed between the input sensor and the polarizer; an upper retarder disposed on the anti-reflector, the upper retarder having a Young's modulus of about 4 GPa to about 100 GPa; a window disposed on the upper retarder and having an upper surface facing away from the upper retarder; and at least one adhesion member disposed between the input sensor and the window, wherein a thickness from the upper surface of the input sensor to the upper surface of the window is about 130 μm to about 540 μm.

19 Claims, 18 Drawing Sheets

(51) Int. Cl.
*H01L 27/32* (2006.01)
*G02B 5/30* (2006.01)
*G06F 3/047* (2006.01)
*G09F 9/30* (2006.01)
*G06F 1/16* (2006.01)

(52) U.S. Cl.
CPC .......... *G06F 3/0412* (2013.01); *H01L 27/323* (2013.01); *H01L 51/5246* (2013.01); *H01L 51/5253* (2013.01); *G06F 1/1616* (2013.01); *G06F 1/1641* (2013.01); *G06F 2203/04102* (2013.01); *G09F 9/301* (2013.01); *H01L 27/3244* (2013.01); *H01L 51/5237* (2013.01); *H01L 51/5293* (2013.01); *H01L 2251/5338* (2013.01); *H01L 2251/558* (2013.01)

(58) Field of Classification Search
CPC .............. H01L 51/5281; H01L 51/5246; H01L 51/5253; H01L 51/5293; H01L 51/5237; H01L 27/323; H01L 27/3244; H01L 2251/558; H01L 2251/5338; G02B 5/3016; G09F 9/301
See application file for complete search history.

(56) References Cited

U.S. PATENT DOCUMENTS

| | | | |
|---|---|---|---|
| 10,031,265 B2 | 7/2018 | Kwon et al. | |
| 2010/0188341 A1* | 7/2010 | Shen | G06F 3/041 345/173 |
| 2014/0176880 A1* | 6/2014 | Cho | G02B 5/3083 349/96 |
| 2015/0212548 A1* | 7/2015 | Namkung | G06F 1/1643 345/174 |
| 2016/0155967 A1* | 6/2016 | Lee | G06F 3/0446 257/88 |
| 2016/0291228 A1* | 10/2016 | Lee | G02B 27/286 |
| 2017/0031074 A1* | 2/2017 | Kong | G02F 1/133528 |
| 2017/0147117 A1* | 5/2017 | Song | G06F 3/0443 |
| 2017/0200915 A1 | 7/2017 | Lee et al. | |
| 2017/0278902 A1 | 9/2017 | Choi et al. | |
| 2018/0081223 A1 | 3/2018 | Chen et al. | |
| 2018/0090720 A1* | 3/2018 | Hack | H01L 51/5293 |
| 2018/0149785 A1 | 5/2018 | Lee et al. | |
| 2018/0348419 A1 | 12/2018 | Iida | |
| 2018/0357462 A1* | 12/2018 | Mackey | G06F 1/1637 |
| 2019/0278010 A1* | 9/2019 | Sakai | G02F 1/133528 |

FOREIGN PATENT DOCUMENTS

| | | |
|---|---|---|
| KR | 10-2017-0001844 | 1/2017 |
| KR | 10-1735689 | 5/2017 |
| KR | 10-2017-0084402 | 7/2017 |
| KR | 1020180057586 | 5/2018 |

* cited by examiner

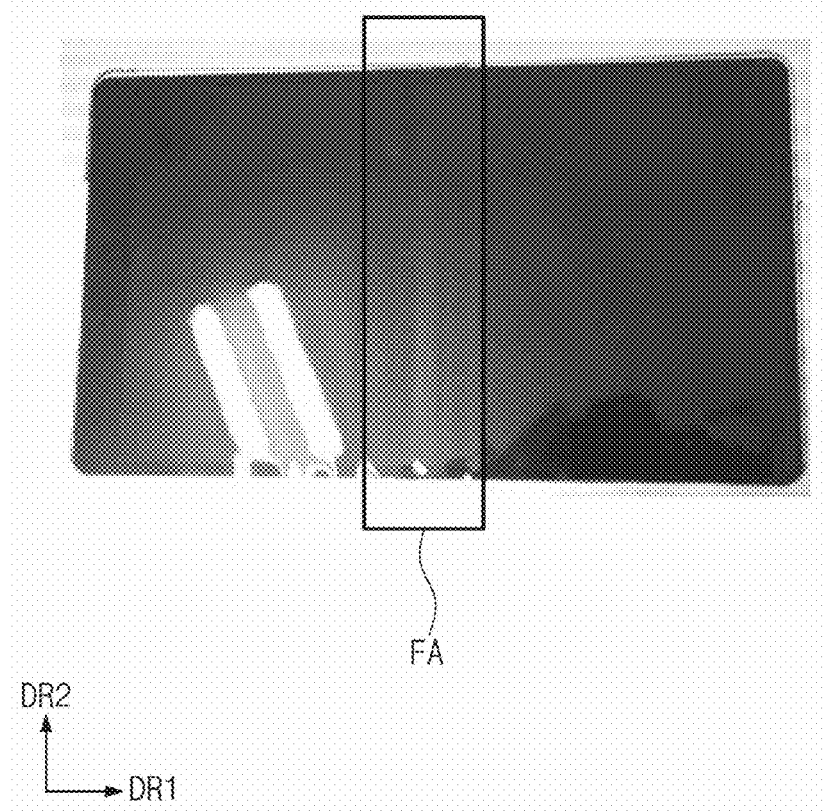

FOLDABLE DISPLAY DEVICE INCLUDING RETARDER

CROSS-REFERENCE TO RELATED APPLICATION

This application claims priority from and the benefit of Korean Patent Application No. 10-2018-0102510, filed on Aug. 30, 2018, which is hereby incorporated by reference for all purposes as if fully set forth herein.

BACKGROUND

Field

Exemplary implementations of the invention relate generally to a foldable display device and, more specifically, to a foldable display device having reduced optical or mechanical defects.

Discussion of the Background

Various display devices, which are to be used in a multi-media device such as a television, a mobile phone, a tablet computer, a navigator, or a game player, are being developed. Forms of the display devices are changed to be suitable for usage of multimedia devices.

Recently, various types of flexible devices are being developed. For example, rollable, foldable, or stretchable display devices are being developed. As the various types of the display devices are developed, efforts have been made to address unexpected defects, such optical defects due to flexibility of the device.

The above information disclosed in this Background section is only for understanding of the background of the inventive concepts, and, therefore, it may contain information that does not constitute prior art.

SUMMARY

Foldable display devices constructed according to exemplary implementations of the invention have displays from which an image may be perceived at any angle, even when a user wears polarized sunglasses.

Foldable display devices constructed according to exemplary implementations of the invention may prevent or suppress folding part discoloration and/or the occurrence of a rainbow mura defects or phenomenon.

Foldable display devices constructed according to exemplary implementations of the invention may prevent or suppress a retarder from being detached.

The durability of foldable display devices may be improved when incorporated with an upper retarder having a Young's modulus according to exemplary implementations of the invention, which prevents or reduces components from being detached from the display despite repetitions in folding and unfolding of the display device.

Additional features of the inventive concepts will be set forth in the description which follows, and in part will be apparent from the description, or may be learned by practice of the inventive concepts.

According to one or more embodiments of the invention, a foldable display device including: a display panel; an input sensor directly disposed on the display panel and having an upper surface; an anti-reflector disposed on the upper surface of the input sensor, the anti-reflector including: a polarizer; and at least one lower retarder disposed between the input sensor and the polarizer; an upper retarder disposed on the anti-reflector, the upper retarder having a Young's modulus of about 4 GPa to about 100 GPa; a window disposed on the upper retarder and having an upper surface facing away from the upper retarder; and at least one adhesion member disposed between the input sensor and the window, wherein a thickness from the upper surface of the input sensor to the upper surface of the window is about 130 µm to about 540 µm.

The upper retarder may have a thickness of about 1 µm to about 80 µm.

The at least one adhesion member may have a thickness of about 5 µm to about 100 µm.

The window may have a thickness of about 30 µm to about 130 µm.

The polarizer may have a polarization axis of substantially parallel to or substantially perpendicular to a folding axis of the foldable display device.

The lower retarder may include a positive dispersion type $\lambda/2$ retarder; and a positive dispersion type $\lambda/4$ retarder, wherein a slow axis of the positive dispersion type $\lambda/2$ retarder and a slow axis of the positive dispersion type $\lambda/4$ retarder may be defined on an identical quadrant by the folding axis and a reference axis perpendicular to the folding axis.

An angle between a slow axis of the upper retarder and the polarization axis of the polarizer may be about 10 degrees to 75 degrees. An angle between the polarization axis of the polarizer and the slow axis of the positive dispersion type $\lambda/4$ retarder may be about 7.5 degrees to about 17.5 degrees, and an angle between the slow axis of the positive dispersion type $\lambda/4$ retarder and the slow axis of the positive dispersion type $\lambda/2$ retarder may be about 50 degrees to about 70 degrees.

The lower retarder may include a negative dispersion type $\lambda/4$ retarder, and a slow axis of the lower retarder may form an angel of about 45 degrees with the polarization axis of the polarizer.

The window may include a base layer having a phase retardation of about 0 nm to about 500 nm at about 550 nm wavelength.

The polarizer may have a polarization axis that forms an angle of about 45 degrees with respect to a folding axis of the foldable display device, and wherein the lower retarder may include a negative dispersion type $\lambda/4$ retarder.

The window may include a base layer having a phase retardation of about 500 nm or shorter at about 550 nm wavelength.

The upper retarder may have a phase retardation of about 5000 nm to about 11000 nm at 550 nm wavelength.

Each of the upper retarder and the lower retarder may include a base layer and a liquid crystal layer aligned on one surface of the base layer.

the display panel may include a light emitting elements and a plurality of first thin films configured to cover the light emitting elements, and the input sensor may include conductive patterns disposed on the plurality of thin films and at least one second thin film disposed on the conductive patterns.

at least a part of the conductive patterns may have mesh shapes.

According to one or more embodiments of the invention, a display module having a display panel and an input sensor directly disposed on the display panel; a first adhesion member connected to the display module; anti-reflector connected to the first adhesion member; a second adhesion member connected to the anti-reflector; an upper retarder connected to the second adhesion member and having a Young's modulus of about 4 GPa to about 100 GPa; a third adhesion member connected to the upper retarder; and a window connected to the third adhesion member and having a phase retardation of about 0 nm to about 500 nm at about 550 nm wavelength, wherein the anti-reflector includes: a polarizer disposed between the second adhesion member and the first adhesion member; and a positive dispersion type λ/2 retarder and a positive dispersion type λ/4 retarder disposed between the polarizer and the first adhesion member, and wherein a total thickness of the first adhesion member, the anti-reflector the second adhesion member, the upper retarder, the third adhesion member, and the window is about 130 μm to about 540 μm.

The polarizer may have a polarization axis substantially parallel to or substantially perpendicular to a folding axis of the foldable display device.

According to one or more embodiments of the invention, a foldable display device includes: a display module having a display panel and an input sensor directly disposed on the display panel; a first adhesion member coupled to the display module, the lower adhesion member having a lower surface facing the display module; anti-reflector coupled to the first adhesion member; a second adhesion member coupled to the anti-reflector; an upper retarder coupled to the second adhesion member, the upper retarder having a Young's modulus of about 4 GPa to about 100 GPa; a third adhesion member coupled to the upper retarder; and a window coupled to the third adhesion member, the window having a phase retardation of about 0 nm to about 500 nm at about 550 nm wavelength and having an upper surface facing away from the upper retarder, wherein the anti-reflector may include: a polarizer disposed between the second adhesion member and the first adhesion member; and a negative dispersion type λ/4 retarder disposed between the polarizer and the first adhesion member, wherein a thickness from the lower surface of the first adhesion member to the upper surface of the window may be about 130 μm to about 540 μm.

The polarizer may have a polarization axis forming an angle of about 45 degrees with the folding axis of the foldable display device.

The window may include a base layer, the base layer may have a phase retardation of about 500 nm or shorter at about 550 nm wavelength.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4F is a photograph of a discoloration defect in a folding part of a display device.

DETAILED DESCRIPTION

Figure 1A:
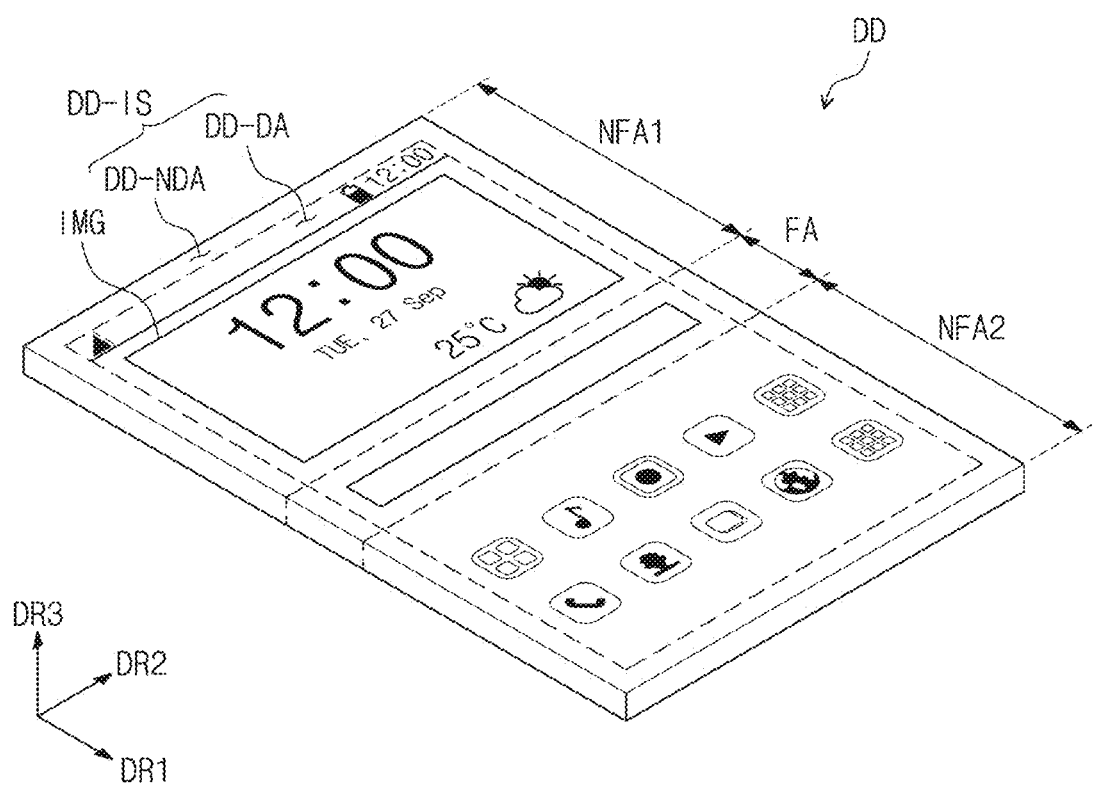
FIGS. 1A, 1B, and 1C are perspective views of a foldable display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
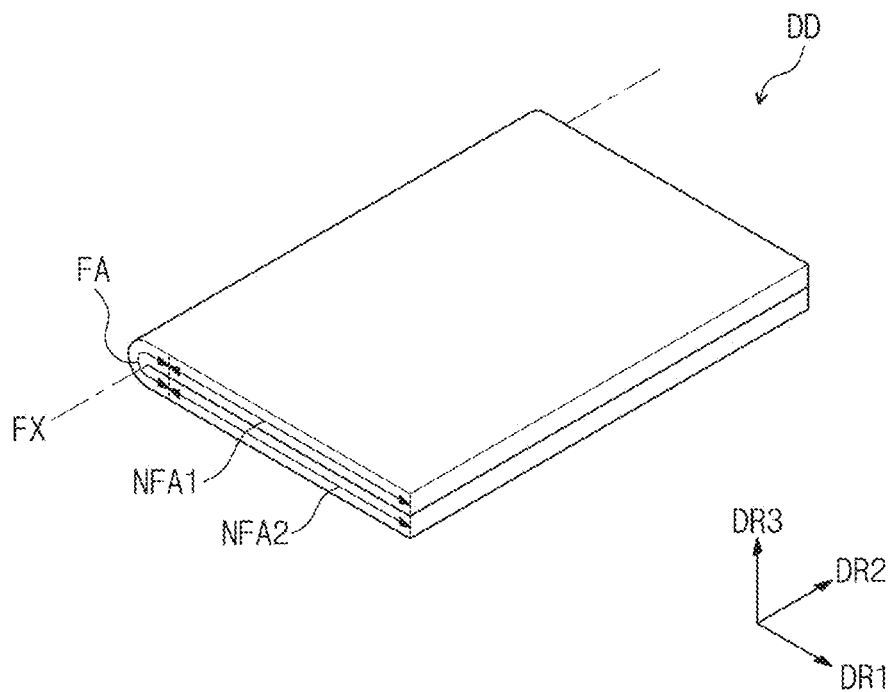
Figure 1C:
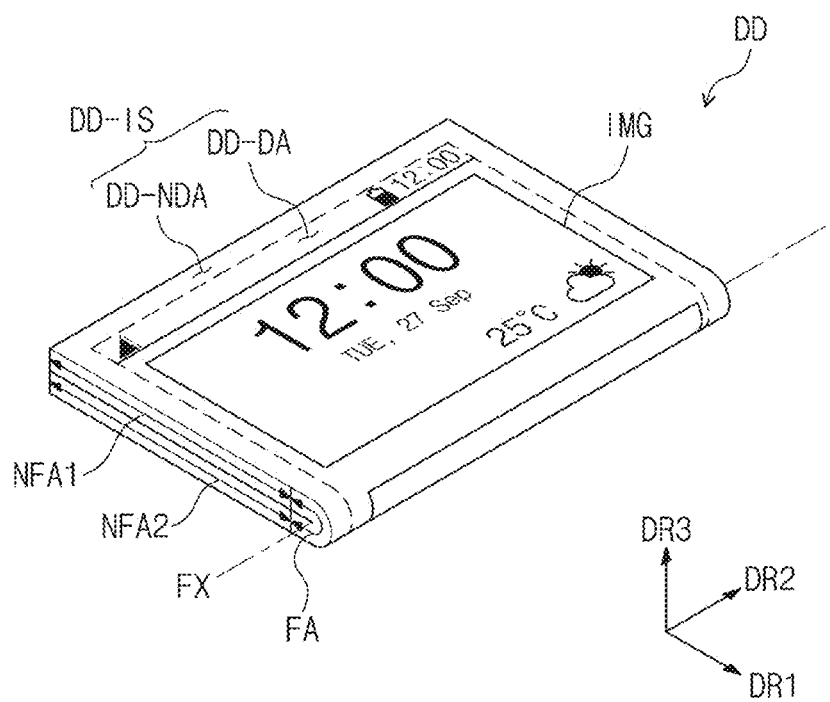

FIGS. 1A, 1B, and 1C are perspective views of a display device DD according to an exemplary embodiment of the invention. As shown in FIG. 1A, the display device DD may display an image IMG on a display surface DD-IS. The display surface DD-IS is parallel to a surface defined by a first directional axis DR1 and a second directional axis DR2. A normal direction of the display area DD-IS, namely, a thickness direction of the display device DD is indicated by a third directional axis DR3.

A front surface (or upper surface) and a rear surface (or lower surface) of each member or each unit to be described below are divided by the third directional axis DR3. However, the first to third directional axes DR1, DR2, and DR3 shown in the illustrated embodiments are just examples. Hereinafter, the first to third directions are directions respectively indicated by the first to third directional axes DR1, DR2, and DR3 and refer to the same reference numerals.

As illustrated in FIG. 1A, the display surface DD-IS includes a display area DM-DA on which the image IMG is displayed and a non-display area DD-NDA adjacent to the display area DD-DA. The non-display area DD-NDA is an area on which the image is not displayed. As an example of the image IMG, icon images are illustrated in FIG. 1A.

As illustrated in FIG. 1A, the display area DD-DA may have a rectangular shape. The non-display area DD-NDA may surround the display area DD-DA. However, exemplary embodiments of the invention are not limited thereto, and the shapes of the display area DD-DA and the non-display area DD-NDA may be relatively designed.

As illustrated in FIGS. 1A, 1B, and 1C, the display device DD may include a plurality of areas defined according to an operation type. The display device DD may include a first area NFA1, a second area NFA2, and a third area FA disposed between the first area NFA1 and the second area NFA2. The third area FA is an area folded with respect to a folding axis, which is an area substantially forming a curvature. Hereinafter, the first area NFA1, the second area NFA2, and the third area FA may be referred to as a first non-folding area NFA1, a second non-folding area NFS2, and a folding area FA.

As illustrated in FIG. 1B, the display device DD may be inwardly-folded such that the display surface DD-IS of the first non-folding area NFA1 and the display surface DD-IS of the second non-folding area NFA2 face each other. As illustrated in FIG. 1C, the display device DD may be outwardly-folded to expose the display surface DD-IS externally.

The display device DD in an exemplary embodiment of the invention may include a plurality of folding areas FA. In addition, the folding area FA may be defined to correspond to a type that a user operates the display device DD. For example, unlike FIGS. 1B and 1C, the folding area FA may be defined to be parallel to the first directional axis DR1 or may be defined in a diagonal direction. The dimension of the folding area FA may not be fixed but be determined according to the radius of the curvature. The display device DD may be configured such that only an operation mode illustrated in FIGS. 1A and 1B is repeated, or only an operation mode illustrated in FIGS. 1A and 1C is repeated.

The display device DD, which may be applied to a mobile phone, is illustrated as an example. Electronic modules, camera modules, power supply modules, and the like may be disposed in a bracket/case or the like together with the display device DD to form a mobile terminal. The display device DD may be applied to a large-sized electronic device such as a television or a monitor, or a small or medium-sized electronic device such as a tablet, a vehicle navigator, a game player or a smart watch.

Figure 2A:
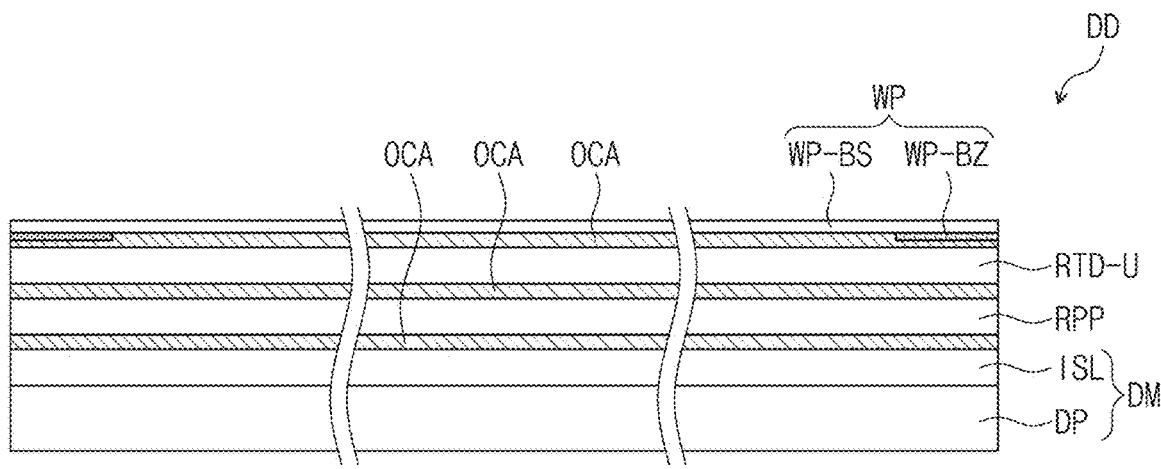
FIGS. 2A and 2B are cross-sectional views of the display device of FIGS. 1A, 1B, and C according to exemplary embodiments of the invention.
Figure 2B:
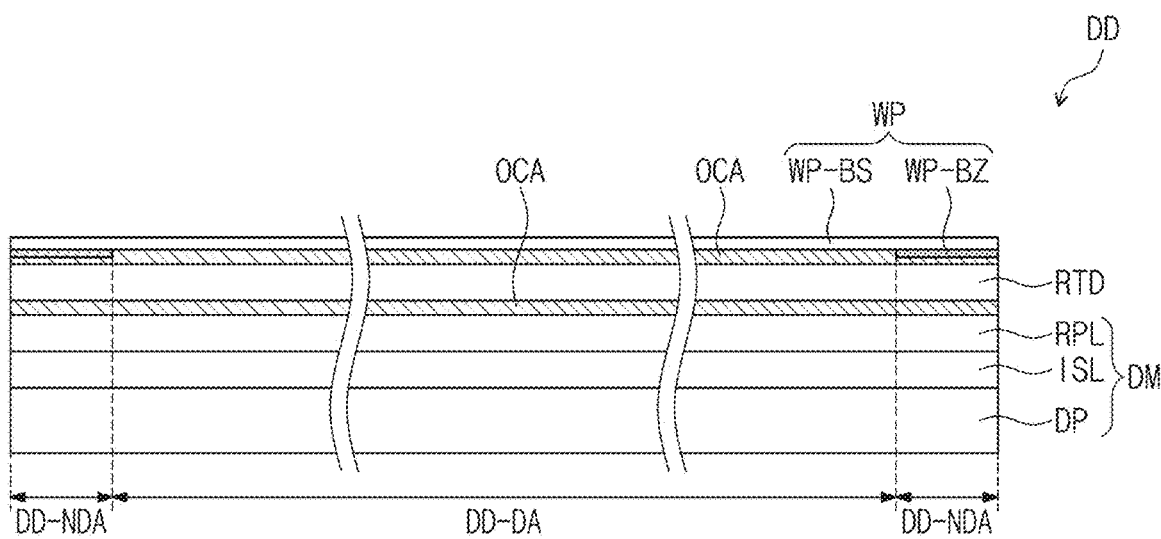

FIGS. 2A and 2B are cross-sectional views of the display device DD of FIGS. 1A, 1B, and C according to an exemplary embodiment of the invention. FIGS. 2A and 2B illustrate cross sections defined by the second directional axis DR2 and the third directional axis DR3. FIGS. 2A and 2B are simply illustrated in order to explain laminate relationships between a display panel and functional units composing the display device DD.

The display device DD may include a display panel, an input sensor, anti-reflector and a window. In addition, the display device DD additionally includes a retarder separated from the anti-reflector. The added retarder is disposed between the anti-reflector and the window, and an adhesion member is disposed between the anti-reflector and the retarder.

At least a part of components including the display panel, the input sensor, the anti-reflector, and the window may be formed in a consecutive process, or at least a part of the components may be combined with each other through the adhesion member. FIG. 2A exemplarily illustrates an optically clear adhesive (OCA) as the adhesion member. An adhesion member to be described below may include a typical adhesive or a gluing agent, and may include all of sheet types and resin type ones. In some exemplary embodiments of the invention, the optically clear adhesive (OCA) may be a pressure sensitive adhesive (PSA).

In FIGS. 2A and 2B, the input sensor, the anti-reflector, and the window, may be formed through a consecutive process with other components in which case they are represented as "a layer". The input sensor, the anti-reflector, and the window, may be connected with other components through an adhesion member, in which case they are represented as "a panel". The "panel" structure includes a base layer that provides a base surface, for example, a synthetic resin film, a composite material film, a glass substrate, or the like. On the other hand, in the "layer" structure, the base layer may be omitted. In other words, a component described as a "layer" is disposed on a base surface provided by another unit.

Accordingly, the input sensor, the anti-reflector, and the window including the base layer may be referred to as an input sensing panel, a reflection prevention panel, and a window panel, or the input sensor, the anti-reflector, and the window not including the base layer may be referred to as an input sensing layer, a reflection prevention layer, and a window layer, respectively, according to presence or absence of the base layer.

As shown in FIG. 2A, the display device DD may include a display panel DP, an input sensing layer ISL, a reflection prevention panel RPP, a retarder RTD-U (hereinafter, an upper retarder), and a window panel WP. The input sensing layer ISL may be directly disposed on the display panel DP. In the specification, use of "component B being directly disposed on component A" means that a separate adhesion layer/adhesion member is not disposed between component A and component B. In other words, component B is provided through a consecutive process on a base surface provided by component A, after component A is provided.

The display panel DP and the input sensing layer ISL are defined as the display module DM. The optical clear adhesive OCA is disposed between the display module DM and the reflection prevention panel RPP, between the reflection prevention and the upper retarder RTD-U, and between the upper retarder RTD-U and the window panel.

The display panel DP generates an image and the input sensing layer ISL acquires coordinate information on an external input (e.g., a touch event). The input sensing layer ISL may be a touch sensing sensor for sensing a touch by a user, or a fingerprint sensing sensor for sensing fingerprint information on a user's finger. The display module DM may further include a protection member disposed in the lower surface of the display panel DP. The protection member and the display panel DP may be combined through an adhesion member. Also, the display devices DD in FIG. 2B to be explained hereinafter may further include a protection member.

The display panel DP may be a light emission type display panel, but is not particularly limited thereto. For example, the display panel DP may be an organic light emitting display panel or a quantum dot light emitting display panel or any other known display panel. The light emitting layer of the organic light emitting display panel includes an organic light emitting material. The light emitting layer of the quantum dot light emitting display panel may include a quantum dot and a quantum rod. Hereinafter the display panel DP will be described as an organic light emitting display panel.

The reflection prevention panel RPP reduces a reflection ratio of external light input from an upper side of the window panel WP. The reflection prevention panel RPP may include at least one retarder (hereinafter, a lower retarder) and a polarizer.

The upper retarder TRD-U and at least one lower retarder may be a film type or a liquid crystal coating type. The polarizer may also be a film type or a liquid crystal type. The film type may include a stretched synthetic resin film, and a liquid crystal coating type may include a base layer and a liquid crystal layer aligned on one surface of the base layer. The retarder and the polarizer may further include a support film and/or a protection film.

The window panel WP according to an exemplary embodiment of the invention includes a base layer WP-BS and a bezel pattern WP-BZ. The base layer WP-BS may include a glass substrate and/or a synthetic resin film, etc. The base layer WP-BS is not limited to a single layer. The base layer WP-BS may include two or more films combined through the adhesion member.

The base layer WP-BS may not have phase retardation or may have a low phase retardation. The glass substrate may not substantially have phase retardation. A synthetic film such as PET or PI may have a low phase retardation of about 500 nm or smaller. As a result, the base layer WP-BS may have a phase retardation of about 0 nm to about 500 nm at about 550 nm wavelength.

The bezel pattern WP-BZ partially overlaps the base layer WP-BS. The bezel pattern WP-BZ is disposed on the rear surface of the base layer WP-BS and may define a Bezel area, namely, a non-display area DD-NDA (see FIG. 1A) of the display device DD.

The bezel pattern WP-BZ may be formed with a colored organic film, for example, in a coating manner. The bezel pattern WP-BZ may include a multi-layered organic film. On a part of the organic films, a prescribed pattern may be formed. The window panel WP may further include a functional coating layer disposed on a front surface of the base layer WP-BS. The functional coating layer may include a fingerprint prevention layer, a reflection prevention layer, and a hard coating layer, etc.

As shown in FIG. 2B, the display device DD may include a display panel DP, an input sensing layer ISL, a reflection prevention layer RPL, an upper retarder RTD-U, and a window panel WP. Here, the reflection prevention layer RPL is a liquid crystal coating type, and may include a liquid crystal layer directly aligned on the upper surface of the input sensing layer ISL. The reflection prevention layer RPL may include a plurality of liquid crystal layers.

The window panel WP in an exemplary embodiment of the invention may be modified to a window layer coated on the upper retarder.

Figure 3A:
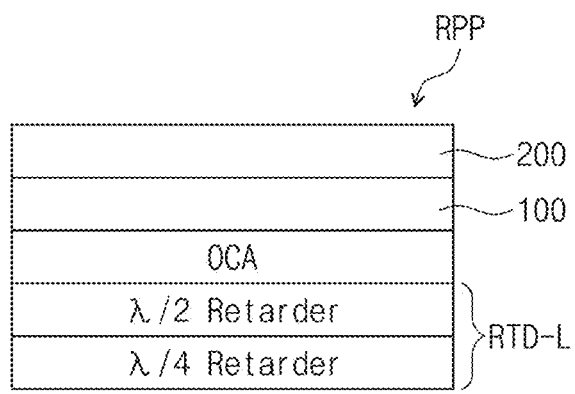
FIGS. 3A and 3B are cross-sectional views of anti-reflectors constructed according to exemplary embodiments of the invention.
Figure 3B:
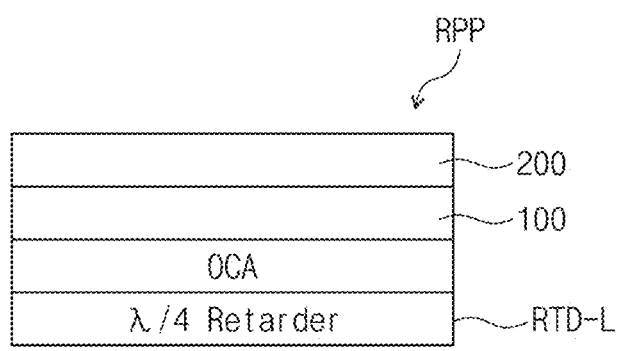

FIGS. 3A and 3B are cross-sectional views of the reflection prevention panel RPP according to an exemplary embodiment of the invention. FIGS. 3A and 3B illustrate the reflection prevention panel RPP in a panel type.

As illustrated in FIG. 3A, the reflection prevention panel RPP may include a stretched polarizer. The stretched polarizer may include a Poly Vinyl Alcohol (PVA) film 100 containing iodine or a dichroic dye. The reflection prevention panel RPP may include a protection film 200. The protection film 200 may be a Tri-Acetyl Cellulose (TAC) film. The reflection prevention panel RPP is exemplarily illustrated in which the protection film 200 is disposed only one surface of the PVA film 100, but the inventive concepts are not limited thereto. On the other hand, the liquid crystal type polarizer may include an O-type polarizing layer in which a liquid-crystalline composition containing a dichroic material and a liquid-crystalline compound is aligned in a certain direction, and an E type polarizing layer in which lyotropic liquid crystals are aligned in a certain direction. The polarizing layers are aligned on the protection film. Here, the protection film 200 corresponds to a base layer.

The reflection prevention panel RPP may include a $\lambda/2$ retarder, as the lower retarder RTD-L, and a $\lambda/4$ retarder. The PVA film 100 may be combined with the $\lambda/2$ retarder through the adhesion member OCA. The $\lambda/4$ retarder is disposed on a lower side of the $\lambda/2$ retarder. After an alignment film is provided on the base layer, a liquid crystal layer is formed so as to implement the $\lambda/2$ retarder. After the liquid crystal layer is cured, the base layer may be removed, and the alignment film and the liquid crystal layer may be combined to the adhesion member OCA.

After the alignment film is provided to the base layer, a liquid crystal layer is provided to implement the $\lambda/4$ retarder. After the liquid crystal layer is cured, the base layer may be removed, and the alignment film and the liquid crystal layer may be combined to the $\lambda/2$ retarder. An adhesion layer may be further disposed between the $\lambda/2$ retarder and the $\lambda/4$ retarder.

The liquid crystal layers of the $\lambda/2$ retarder and the $\lambda/4$ retarder may include a reactive liquid crystal monomer (e.g., calamitic mesogen expressing a nematic liquid crystal phase), and the alignment film may include polyimide or polyamide. In an exemplary embodiment, the liquid crystal layers of the $\lambda/2$ retarder and the $\lambda/4$ retarder may include a photo-reactive polymer having refractive index anisotropy. Here, the alignment film may be omitted.

Although the $\lambda/2$ retarder and the $\lambda/4$ retarder of the liquid crystal coating type are illustrated, an adhesion member may be further disposed between the $\lambda/2$ retarder and the $\lambda/4$ retarder of a film type. In the illustrated embodiment, each of the $\lambda/2$ retarder and the $\lambda/4$ retarder may be a positive dispersion type retarder in which as a wavelength increases, a phase retardation decreases.

As illustrated in FIG. 3B, the reflection prevention panel RPP may include, as the lower retarder RTD-L, a negative dispersion type $\lambda/4$ retarder that replaces the $\lambda/2$ retarder and $\lambda/4$ retarder of the positive dispersion type. The negative dispersion type $\lambda/4$ retarder may also be a film type or a liquid crystal coating type.

Figure 4A:
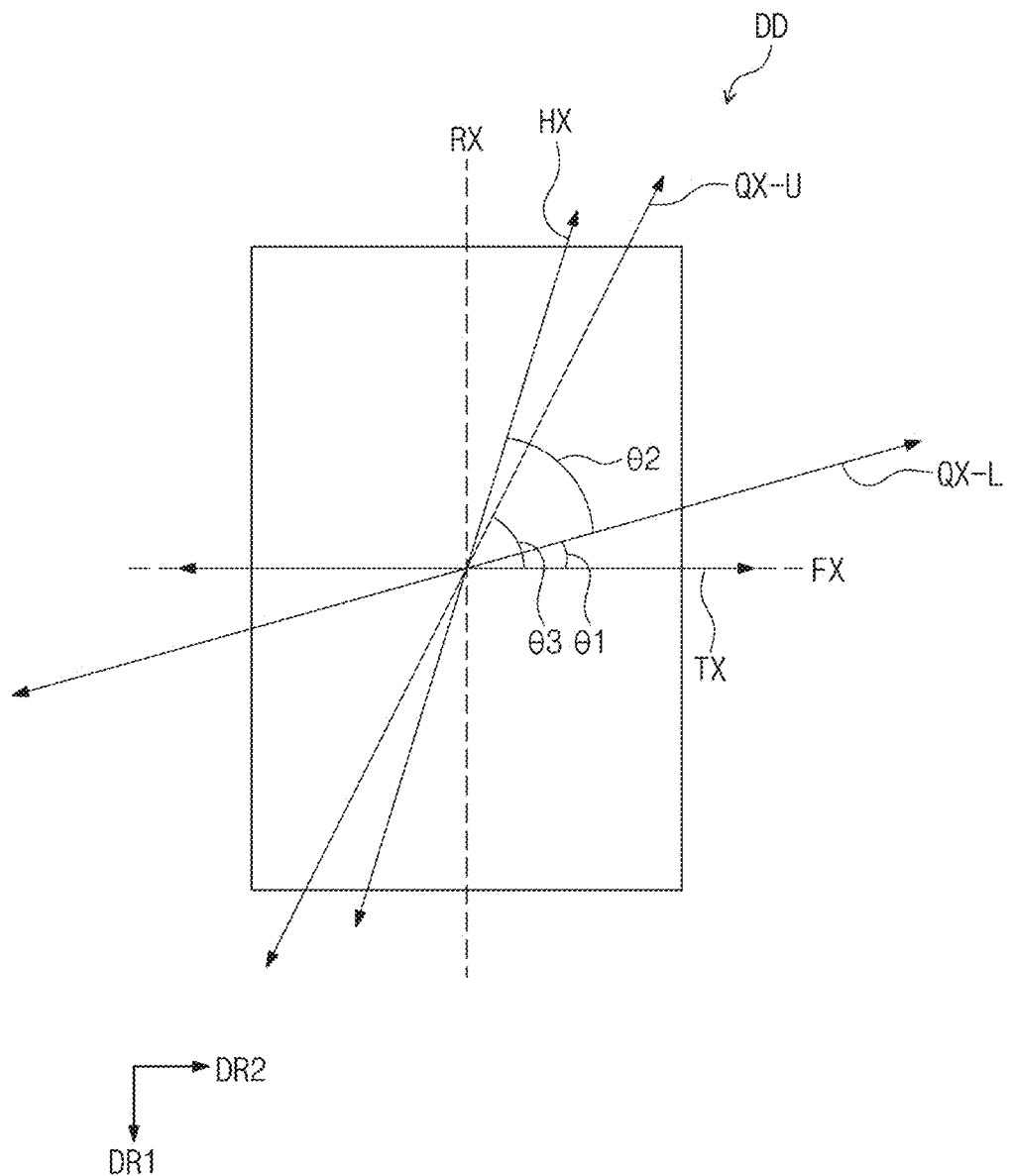
FIG. 4A is a plan view of a relationship between optical axes of a display device constructed according to an exemplary embodiment of the invention.
Figure 4B:
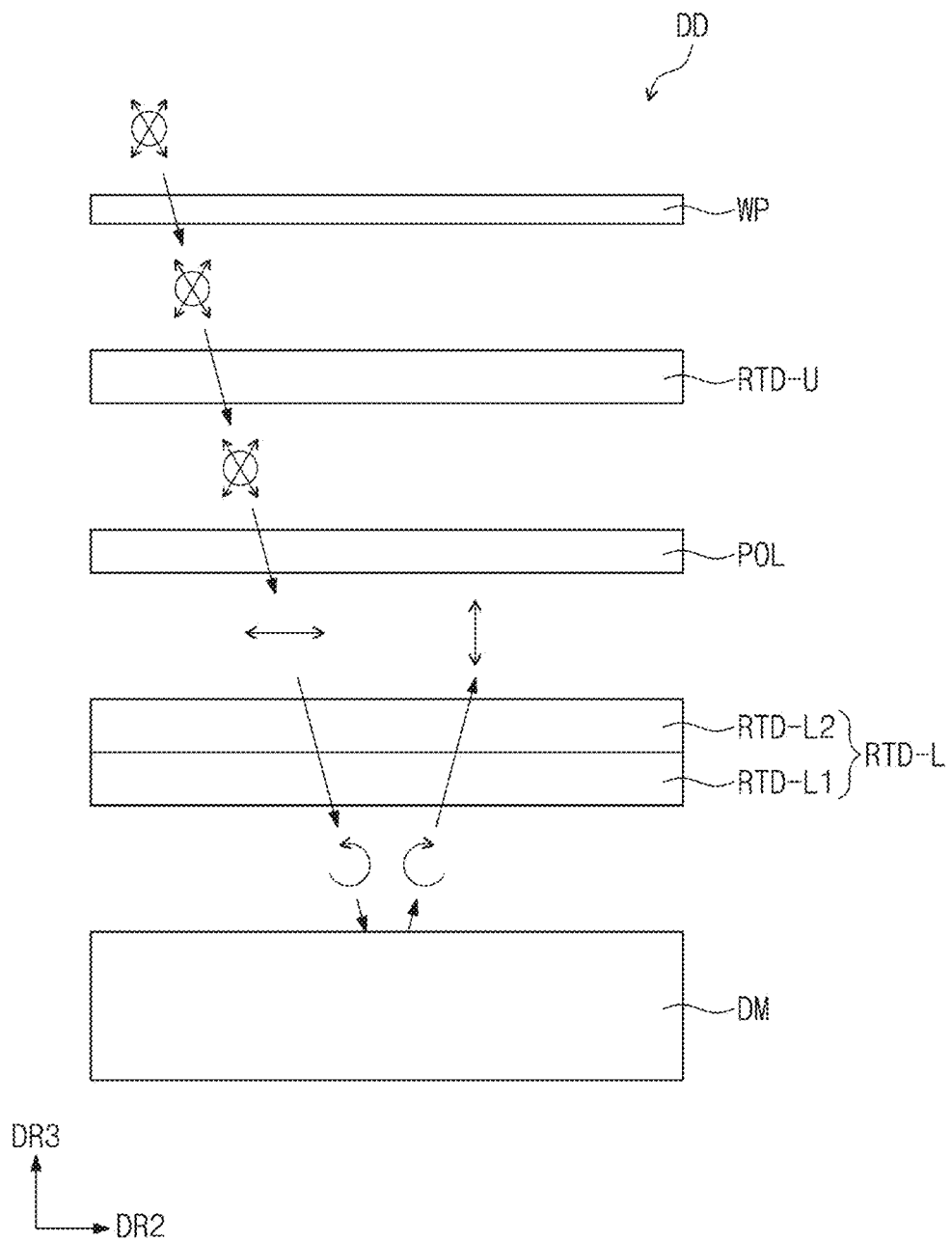
FIGS. 4B and 4C show a light polarization state of a display device constructed according to an exemplary embodiment of the invention.
Figure 4C:
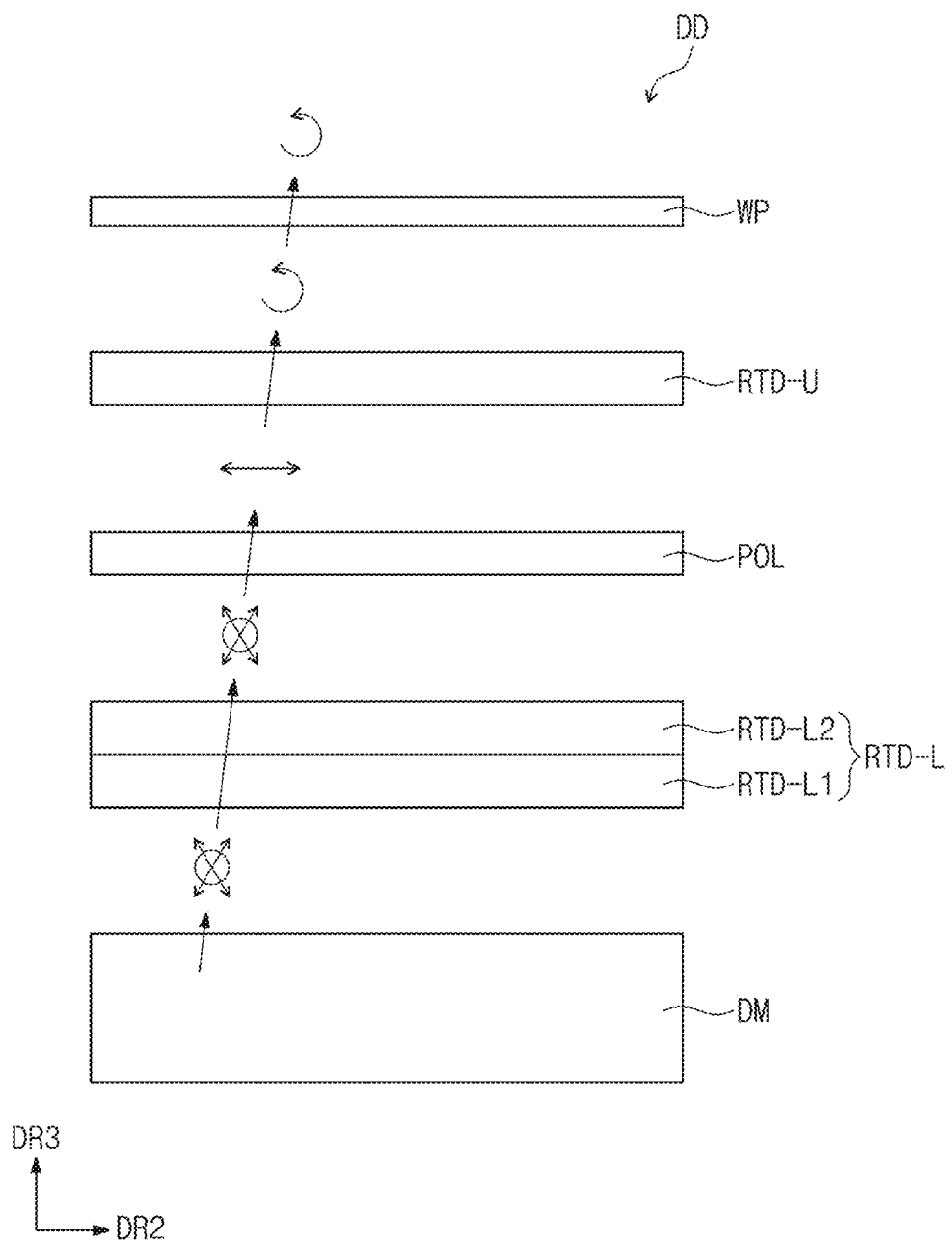
Figure 4D:
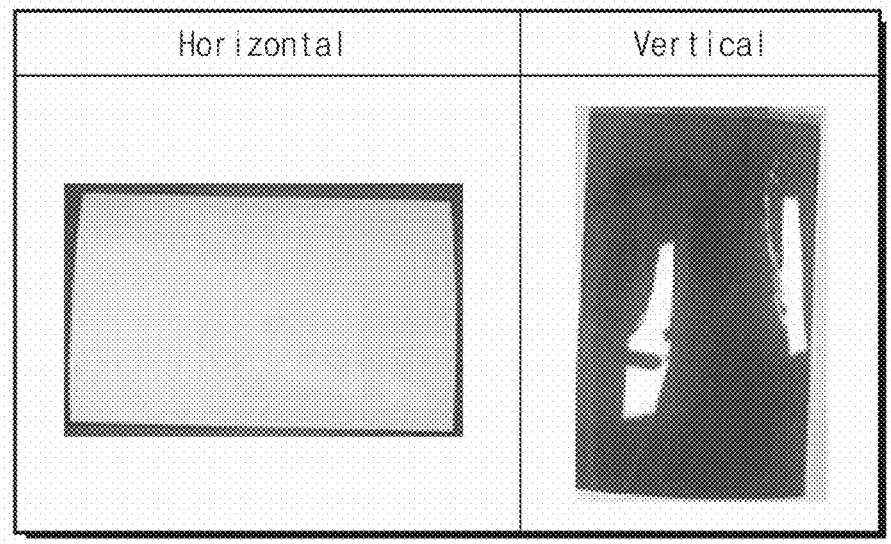
FIG. 4D is a photograph showing a blackout defect in a display device when wearing polarized sunglasses.
Figure 4E:
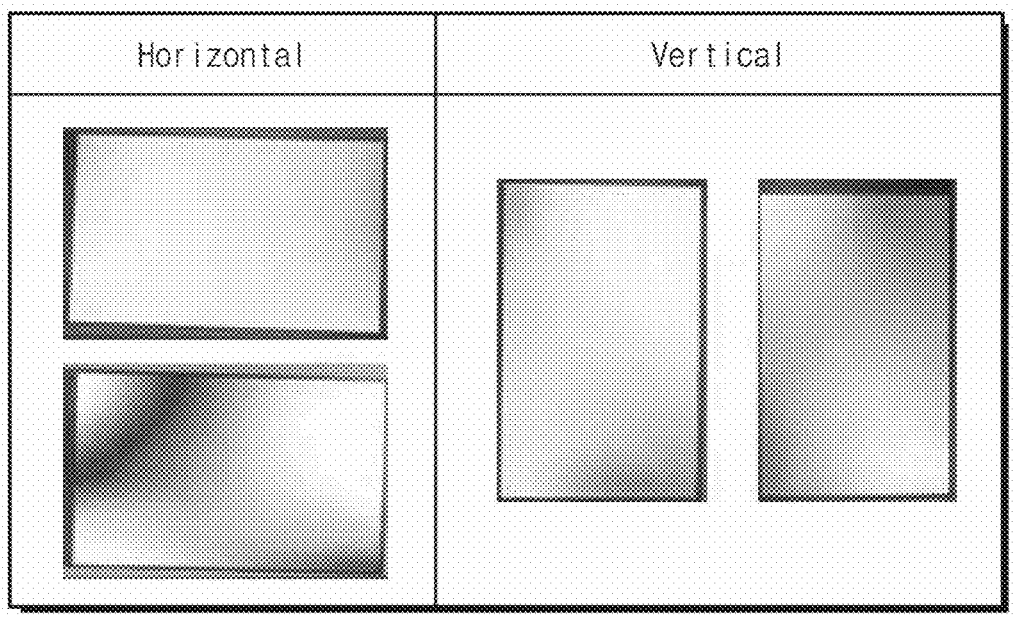
FIG. 4E is a photograph of a rainbow mura defect.

FIG. 4A is a plan view of relationships between the optical axes of the display device DD according to an exemplary embodiment of the invention. FIGS. 4B and 4C show light polarization states of the display device DD according to an exemplary embodiment of the invention. FIG. 4D is a photograph showing a blackout defect in a display device when wearing polarized sunglasses. FIG. 4E is a photograph of a rainbow mura defect. FIG. 4F is a photograph of a discoloration defect in a folding part of a display device.

FIG. 4A illustrates optical axes of the display device DD including the reflection prevention panel RPP shown in FIG. 3A. In the illustrated exemplary embodiment, a folding axis FX is illustrated to be generally parallel to the second directional axis DR2 that is a short axis of the display device DD. A reference axis RX is perpendicular to the folding axis FX, and the reference axis RX and the folding axis FX may define a quadrant. In the exemplary embodiment, a polarization axis TX of the polarizer may be parallel to the folding axis FX. The polarization axis TX may be a transmission axis or an absorption axis, and hereinafter descriptions will be provided as the transmission axis.

As illustrated in FIG. 4B, external light that is not polarized is incident to the display device DD. The external light passes through the window panel WP and the upper retarder RTD-U. In the illustrated embodiment, the upper retarder RTD-U may be a $\lambda/4$ retarder. The $\lambda/4$ retarder may be a negative dispersion type or a positive dispersion type.

The external light passes through the polarizer POL to be linearly polarized. The liner polarization becomes left-circularly polarized while passing through the lower retarder RTD-L. The lower retarder RTD-L may include a first lower retarder RTD-L1 and a second lower retarder RTD-L2. The first lower retarder RTD-L1 and the second lower retarder RTD-L2 may be a positive dispersion type λ/4 retarder and a negative dispersion type λ/4 retarder, respectively.

The left circular polarization becomes right-circularly polarized after being reflected by the display module DM. In the illustrated embodiment, descriptions are provided as the left circular polarization and the right circular polarization, but when the left circular polarization is a circular polarization, the right circular polarization may be a reverse circular polarization.

The right circular polarization becomes linearly polarized, while passing through the lower retarder RTD-L. Here, the linear polarization is perpendicular to the transmission axis of the polarizer POL. In this way, the external light may be suppressed from being reflected.

As illustrated in FIG. 4C, light (or an image IMG, see FIG. 1A) generated in the emission type display module DM is not polarized yet. The light generated in the emission type display module DM passes through the lower retarder RTD-L. The light generated in the emission type display module DM becomes linearly polarized while passing through the polarizer POL. The liner polarization may become left-circularly polarized while passing through the upper retarder RTD-U. The left circular polarization passes through the window panel WP to be provided to the user.

In the illustrated embodiment, since the display device DD includes the upper retarder RTD-U, the external light reflection ratio becomes lowered and the user may also perceive an image, even when wearing polarized sunglasses.

When there is no the upper retarder RTD-U, the user may not acquire the image in any one of a horizontal state or a vertical state of the display device DD, as shown in FIG. 4D. This is because a linearly polarized image may not be transmitted through the polarized sunglasses in any one of the above-described states (in this case, the polarization axis of the linearly polarized image becomes perpendicular to the polarization axis of the polarized sunglasses). According to the illustrated embodiment, since a circularly polarized image reaches the polarized sunglasses, the user may perceive an image in both of the horizontal state and the vertical state.

In FIG. 4C, when the window panel WP has a low phase retardation, a rainbow mura defect or phenomenon of FIG. 4E may occur. This is because the window panel WP modifies the left circular polarization. Due to the phase retardation in the window panel WP, the left circular polarization is modified to left-handed elliptical polarization.

In the illustrated embodiment, the upper retarder RTD-U may include a high phase retardation film. The upper retarder RTD-U of the high phase retardation film may prevent or suppress the rainbow mura defect or phenomenon illustrated in FIG. 4E. When passing through the polarizing plate of the polarized sunglasses, the left-handed elliptical polarization may be linearly polarized again, and at this point, the rainbow mura defect or phenomenon may occur due to a transmittance difference according to a wavelength. However, the high phase retardation film improves the transmittance in the entire wavelength band of visible light and thus the rainbow mura phenomenon may be prevented or suppressed.

The high phase retardation film has a phase retardation of about 5000 nm or longer at about 550 nm wavelength. Typically, the high phase retardation film has a phase retardation from about 5000 nm to about 11000 nm at about 550 nm wavelength.

When the high phase retardation film is applied to the upper retarder RTD-U, unlike the description provided in relation to FIG. 4C, the linear polarization is not changed to a left circular polarization type, even when passing through the upper retarder RTD-U. But while the linear polarization passes through the high phase retardation film, linear polarization characteristics substantially disappear. Therefore, the user may perceive the image while wearing polarized sunglasses.

FIG. 4F shows a discoloration phenomenon occurring in the folding area FA. Such a discoloration phenomenon occurs, because an angle between a slow axis QX-L (see FIG. 4A) of the positive dispersion type λ/4 retarder RTD-L1 and a slow axis HX of the positive dispersion type λ/2 retarder RTD-L2 (see FIG. 4A) is changed, when the display device DD is repeatedly folded and unfolded. In other words, this is because the angle between the slow axis QX-L and the slow axis HX increases due to a tensile force, or the angle between the slow axis QX-L and the slow axis HX decreases due to a compression force. This presupposes that the slow axis QX-L of the positive dispersion type λ/4 retarder RTD-L1 and the slow axis HX of the positive dispersion type λ/2 retarder RTD-L2 are defined on different quadrants.

As shown in FIG. 4A, the slow axis QX-L of the positive dispersion type λ/4 retarder RTD-L1 and the slow axis HX of the positive dispersion type λ/2 retarder RTD-L2 may be defined on the same quadrant in quadrants defined by the reference axis RX and the folding axis FX. As shown in FIG. 4A, the slow axis QX-L of the positive dispersion type λ/4 retarder RTD-L1 and the slow axis HX of the positive dispersion type λ/2 retarder RTD-L2 may be defined on the same quadrant. Then, even when the display device DD is repeatedly folded, the angle between the slow axis QX-L of the positive dispersion type λ/4 retarder RTD-L1 and the slow axis HX of the positive dispersion type λ/2 retarder RTD-L2 may not be substantially changed.

An angle θ1 between the polarization axis TX of the polarizer POL and the slow axis QX-L of the λ/4 retarder RTD-L1 may be about 7.5 degrees to about 17.5 degrees. An angle θ2 between the slow axis QX-L of the λ/4 retarder RTD-L1 and the slow axis HX of the λ/2 retarder RTD-L2 may be about 50 degrees to about 70 degrees.

At this point, the slow axis QX-U of the upper retarder may have a prescribed angle with the polarization axis TX of the polarizer POL. An angle θ3 between the slow axis QX-U of the upper retarder and the polarization axis TX of the polarizer POL may be about 10 degrees to about 75 degrees.

When the lower retarder RTD-L includes the negative dispersion type λ/4 retarder shown in FIG. 3B, the same effect as described in relation to FIGS. 4A, 4B, 4C, 4D, 4E, and 4F may be obtained. The slow axis of the lower retarder RTD-L may form an angle of about 45 degrees with the polarization axis TX of the polarizer POL.

Figure 5:
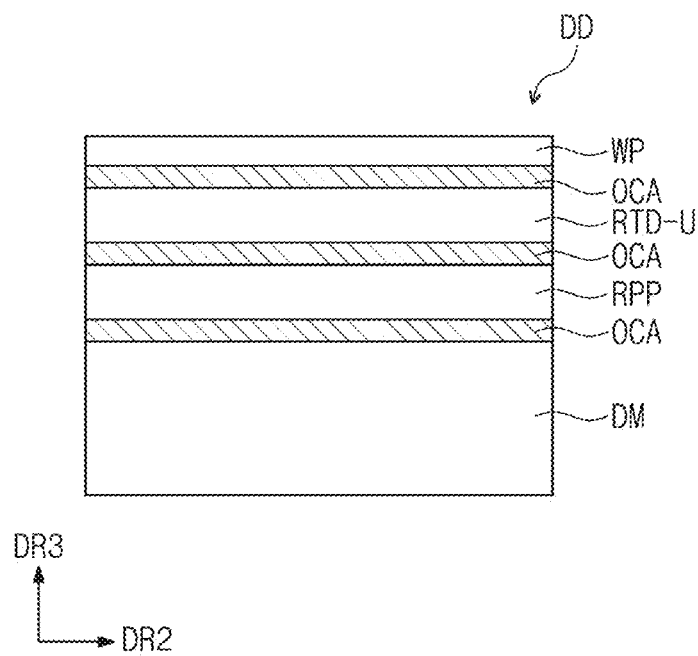
FIG. 5 is a cross-sectional view of a display device constructed according to an exemplary embodiment of the invention.
Figure 6A:
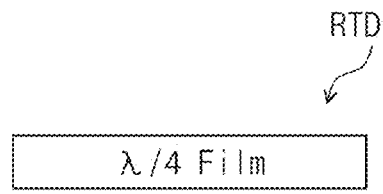
FIGS. 6A and 6B are cross-sectional views of retarders constructed according to exemplary embodiments of the invention.
Figure 6B:
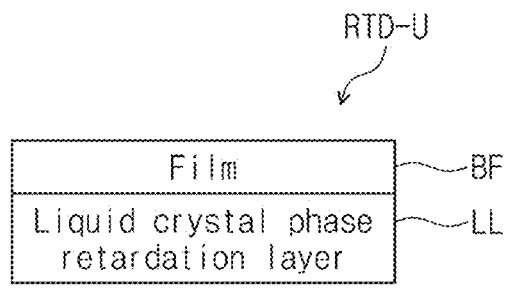

FIG. 5 is a cross-sectional view of a display device DD constructed according to exemplary embodiments of the invention. FIGS. 6A and 6B are cross-sectional views of the upper retarders RTD-U constructed according to exemplary embodiments of the invention.

FIG. 5 schematically illustrates the cross-section of the foldable display device DD shown in FIGS. 1A, 1A, 2A, and 2B. As a folding operation is repeatedly performed, a defect may occur in the foldable display device DD. In the illustrated embodiment, the display device DD satisfying the following conditions may improve shock resistance and flexibility.

The thickness from the upper surface of the display module DM or the lower surface of the adhesion member OCA contacting the display module DM to the upper surface of a window, namely, the window panel WP in the illustrated embodiment may be about 130 µm to about 540 µm. In the display device DD shown in FIG. 2A, the thickness from the upper surface of the input sensing layer ISL to the upper surface of the window WM may be about 130 µm to about 540 µm. In the display device DD shown in FIG. 2B, the thickness from the upper surface of the reflection prevention layer RPL to the upper surface of the window WM may be about 130 µm to 540 µm. When the window panel WP includes a functional coating layer, the upper surface of the window panel WP corresponds to the upper surface of the functional coating layer. Here, the thickness of the window panel WP may be about 30 µm to about 130 µm. When the thickness of the window panel is greater than about 130 µm, a crack may occur at the time of evaluating flexibility, and when smaller than about 30 µm, a dent defect may occur at the time of evaluating the shock resistance. The shock resistance evaluation has been performed through a metal ball drop evaluation.

The flexibility testing was performed under conditions as Table 1 for the display device DD of the structure shown in FIG. 5.

TABLE 1

| Structure | 1 | 2 | 3 |
|---|---|---|---|
| WP(µm) | 130 | 90 | 60 |
| RTD-U(µm) | 50 | 50 | 50 |
| PSA1 to P8A3(µm) | 50 | 50 | 50 |
| RPP(µm) | 30 | 30 | 30 |
| Reliability | NG(crack occurs) | OK | OK |

The thickness of the adhesion member OCA may be about 5 µm to about 100 µm. When the thickness of the adhesion member is greater than about 100 µm, detachment has occurred at the time of evaluating flexibility, and when smaller than about 5 µm, a dent defect has occurred at the time of evaluating the shock resistance.

The flexibility testing was performed under conditions in which the upper retarder RTD-U had a thickness of about 50 µm, the window panel WP had about 60 µm thickness, and the reflection prevention panel RPP had about 30 µm thickness in the display device DD of the structure shown in FIG. 5. A pressure sensitive member was applied as the adhesion member OCA. Among three pressure-sensitive adhesion members PSA1, PSA2, and PSA3, a pressure-sensitive adhesion member contacting the display module was a first pressure-sensitive adhesion member PSA1. The results are shown in the following Tables 2 to 4.

TABLE 2

| | Structure | | | | | | | | |
|---|---|---|---|---|---|---|---|---|---|
| | 1 | 2 | 3 | 4 | 5 | 6 | 7 | 8 | 9 |
| PSA1 (µm) | 150 | 125 | 150 | 135 | 150 | 125 | 135 | 150 | 100 |
| PSA2 (µm) | 100 | 75 | 75 | 75 | 75 | 50 | 50 | 50 | 25 |
| PSA3 (µm) | 25 | 25 | 25 | 25 | 25 | 25 | 25 | 25 | 25 |
| Reliability | NG (detachment occurred) | NG | NG | NG | NG | NG | NG | NG | OK (detachment did not occur) |

TABLE 3

| | Structure | | | | | | | | |
|---|---|---|---|---|---|---|---|---|---|
| | 10 | 11 | 12 | 13 | 14 | 15 | 16 | 17 | 18 |
| PSA1 (µm) | 100 | 50 | 25 | 100 | 75 | 50 | 100 | 25 | 100 |
| PSA2 (µm) | 25 | 50 | 75 | 50 | 50 | 50 | 75 | 75 | 50 |
| PSA3 (µm) | 25 | 50 | 25 | 25 | 25 | 25 | 25 | 25 | 25 |
| Reliability | OK | OK | OK | OK | OK | OK | OK | OK | OK |

TABLE 4

| | Structure | | | | | | | | |
|---|---|---|---|---|---|---|---|---|---|
| | 19 | 20 | 21 | 22 | 23 | 24 | 25 | 26 | 27 |
| PSA1 (µm) | 100 | 75 | 50 | 50 | 25 | 50 | 50 | 50 | 50 |
| PSA2 (µm) | 75 | 75 | 100 | 75 | 100 | 100 | 125 | 130 | 150 |
| PSA3 (µm) | 25 | 25 | 25 | 25 | 25 | 25 | 50 | 50 | 50 |
| Reliability | OK | OK | OK | OK | OK | OK | NG | NG | NG |

The thickness of the upper retarder RTD-U may be about 1 μm to about 80 μm. When the thickness of the upper retarder RTD-U is greater than about 80 μm, detachment occurred during flexibility testing. Even when the upper retarder RTD-U is manufactured in a liquid crystal coating manner, it is substantially difficult to manufacture the same with the thickness thinner than about 1 μm.

The flexibility testing was performed under conditions as [Table 5] for the display device DD having the structure shown in FIG. 5.

TABLE 5

| Structure | 1 | 2 | 3 | 4 |
|---|---|---|---|---|
| WP(μm) | 60 | 60 | 60 | 60 |
| RTD-U(μm) | 80 | 60 | 55 | 30 |
| PSA1 to P8A3(μm) | 50 | 50 | 50 | 50 |
| RPP(μm) | 30 | 30 | 30 | 30 |
| Reliability | NG (detachment occurred) | OK | OK | OK |

In the illustrated embodiment, the thickness of the reflection prevention panel RPP as the anti-reflector may be from about 1 μm to about 50 μm. When the thickness of the reflection prevention panel RPP is greater than about 50 μm, detachment occurred during flexibility testing. Even when the anti-reflector is manufactured in a liquid crystal coating manner, it is substantially difficult to manufacture the same with the thickness thinner than about 1 μm.

FIGS. 6A and 6B are cross-sectional views of the upper retarder RTD-U according to an exemplary embodiment of the invention. FIG. 6A illustrates a stretched λ/4 retarder RTD-U of a film type, and FIG. 6B illustrates a λ/4 retarder RTD-U of a liquid crystal coating type. The λ/4 retarder RTD-U of the liquid crystal coating type includes a base film BF and a liquid crystal phase retardation layer LL.

In order to improve flexibility and reliability of the upper retarder RTD-U, the upper retarder RTD-U has a Young's modulus of about 4 GPa to about 100 GPa. Particularly, the Young's modulus is about 4 GPa to about 15 GPa. The value of the Young's modulus is measured at about 25° C. In the retarder RTD-U of the liquid crystal coating type, the base film BF has a Young's modulus in the above-described range. The upper retarder RTD-U formed from a high phase retardation film has also a Young's modulus in the above-described range in order to improve the flexibility and reliability.

The flexibility testing was performed under conditions in which the window panel WP had about 50 μm thickness, the upper retarder RTD-U has about 50 μm thickness, the reflection prevention panel RPP had about 50 μm thickness, and the adhesion member OCA had about 50 μm thickness in the display device DD of the structure shown in FIG. 5. The results are as the following of Table 6.

TABLE 6

| Young's modulus of upper retarder RTD-U | Environmental condition 1 | Environmental condition 2 | Environmental condition 3 |
|---|---|---|---|
| 6 Gpa | OK (detachment did not occur) | OK | OK |
| 4 Gpa | OK | OK | OK |
| 3.7 Gpa | OK | OK | 1/2 NG |
| 3.3 Gpa | OK | OK | 2/2 NG |

TABLE 6-continued

| Young's modulus of upper retarder RTD-U | Environmental condition 1 | Environmental condition 2 | Environmental condition 3 |
|---|---|---|---|
| 3 Gpa | 1/4 NG (detachment occurred) | 3/4 NG | 2/2 NG |

The environmental condition 1 exposed the display device in a folded state in an environment of about 60° C. temperature and about 93% humidity for 240 hours. The environmental condition 2 alternately exposed the display device in a folded state in an environment of about 60° C. temperature and an environment of about −10° C. temperature. The environmental condition 3 exposed the display device in a folded state in an environment of 70° C. temperature for 72 hours.

For the upper retarder having a Young's modulus of 3.7 GPa, a defect occurred in one of two specimens in the environmental condition 3.

Figure 7:
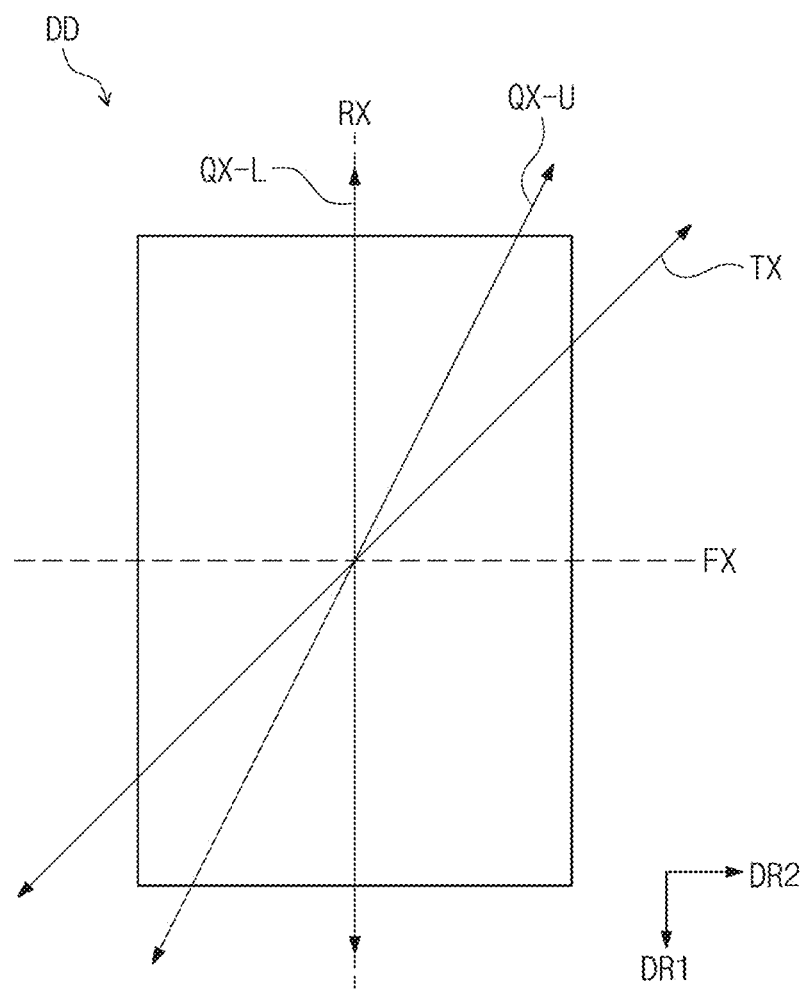
FIG. 7 is a plan view of a display showing a relationship between optical axes according to an exemplary embodiment of the invention.

FIG. 7 is a plan view of a display showing a relationship between the optical axes of the display device DD according to an exemplary embodiment of the invention. Hereinafter, detailed descriptions about the same configurations as those described in relation to FIGS. 1A, 1B, 1C, 2A, 2B, 3A, 3B, 4A, 4B, 4C, 4D, 4E, 4F, 5, 6A, and 6B will be omitted to avoid redundancy.

According to the illustrated embodiment, the polarization axis TX of the polarizer forms an angle with the folding axis FX. For example, the angle may be about 45 degrees. According to the illustrated embodiment, even when the user wears polarized sunglasses, the blackout defect or phenomenon shown in FIG. 4D does not occur. This is because the folding axis FX is not perpendicular to the transmission axis of the polarized sunglasses in a horizontal state or in a vertical state.

In the illustrated embodiment, the lower retarder RTD-U may include a negative dispersion type λ/4 retarder. The slow axis QX-L of the negative dispersion type λ/4 retarder may form about 45 degrees with the polarization axis TX of the polarizer. The lower retarder RTD-L may include one retarder to prevent or suppress a discoloration phenomenon from occurring in the folding area.

In the illustrated embodiment, when the window has low phase retardation, the upper retarder RTD-U may include a high phase retardation film. Accordingly, a rainbow mura defect or phenomenon may be prevented or suppressed. In the illustrated embodiment, "about 45 degrees" includes a range of tolerance due to manufacturing process errors that may occurring when targeting 45 degrees.

Figure 8A:
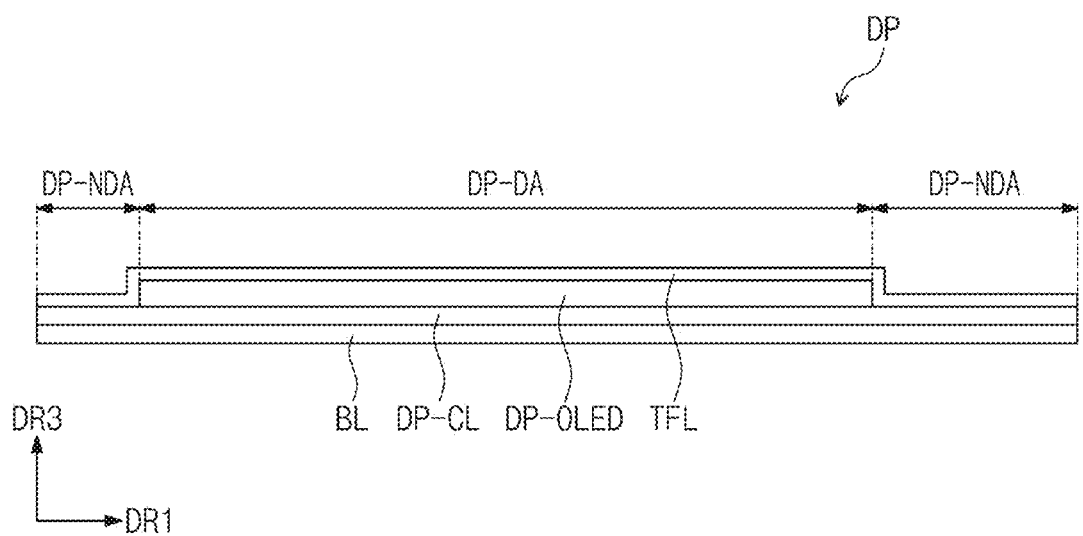
FIG. 8A is a cross-sectional view of a display panel constructed according to an exemplary embodiment of the invention.
Figure 8B:
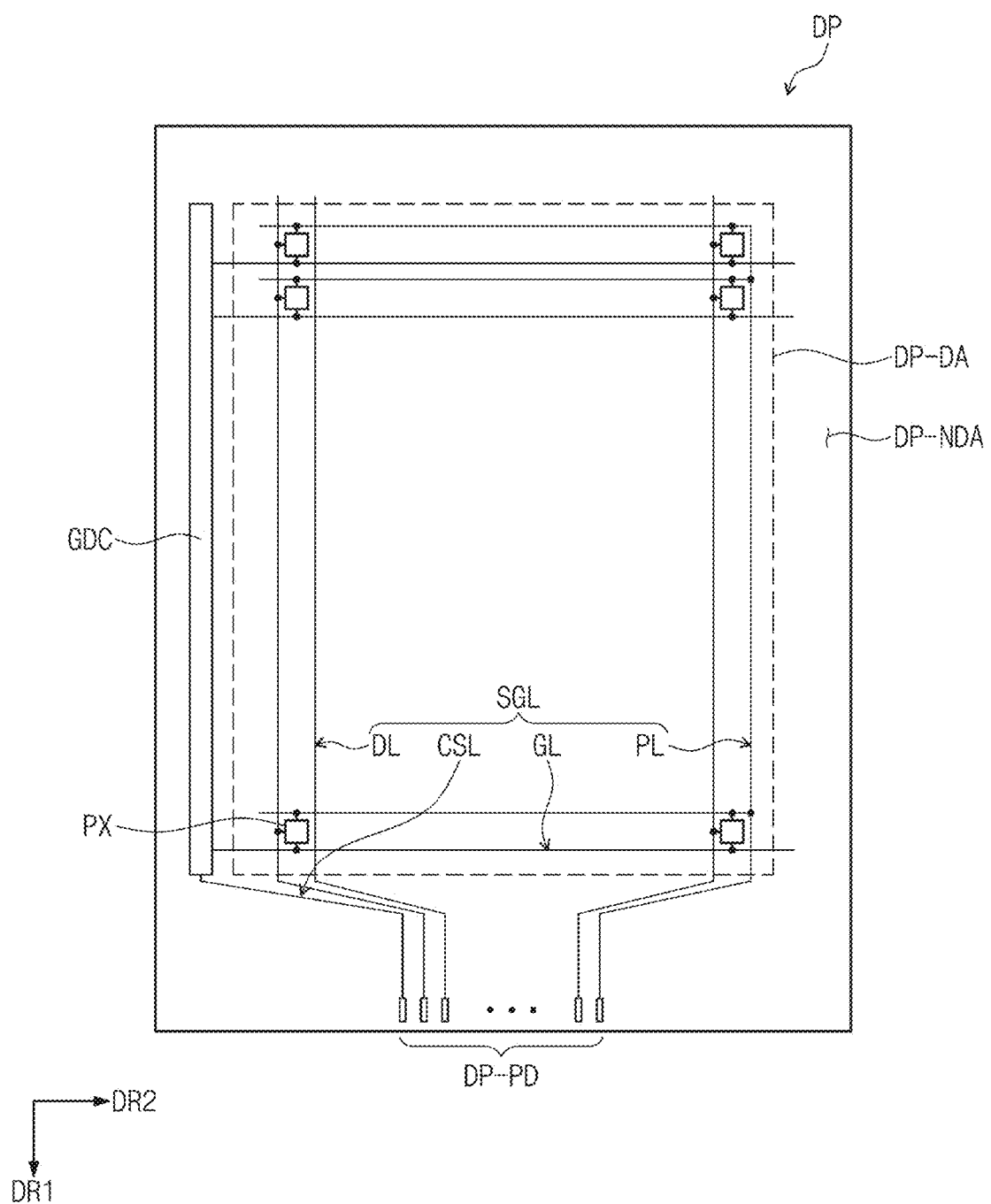
FIG. 8B is a plan view of the display panel of FIG. 8A
Figure 8C:
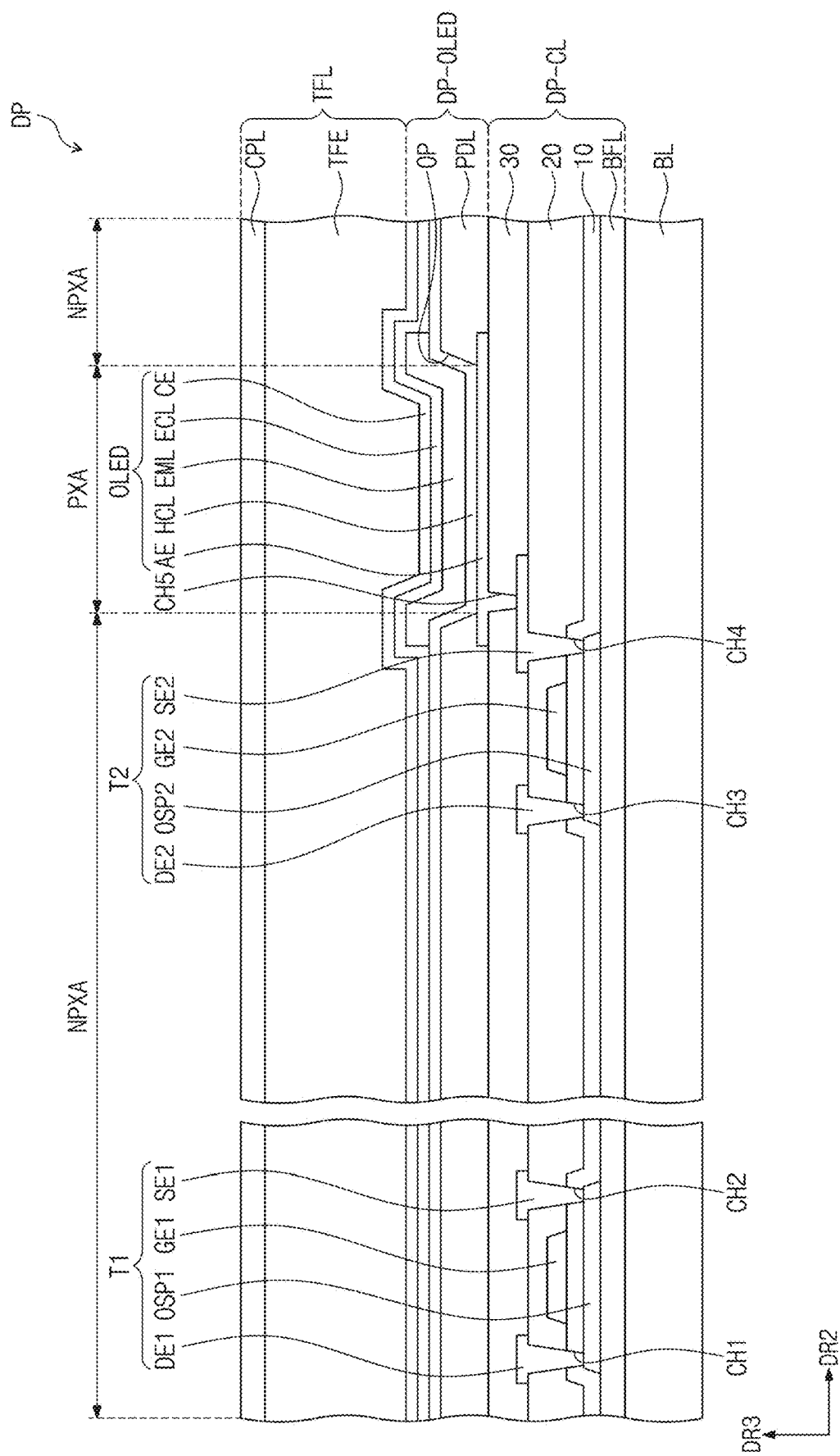
FIG. 8C is an enlarged, partial cross-sectional view of the display panel of FIG. 8A.

FIG. 8A is a cross-sectional view of the display panel DP constructed according to an exemplary embodiment of the invention. FIG. 8B is a plan view of the display panel DP of FIG. 8A. FIG. 8C is an enlarged, partial cross-sectional view of the display panel DP of FIG. 8A.

As shown in FIG. 8A, the display panel DP includes a base layer BL, a circuit is element layer DP-CL disposed on the base layer BL, a display element layer DP-OLED disposed on the circuit element layer DP-CL, and an insulation layer TFL (hereinafter, defined as an upper insulation layer) disposed on the display element layer DP-OLED.

The base layer BL may include a synthetic resin film. The synthetic resin layer is formed on a working substrate used for manufacturing the display panel DP. Then a conduction layer and the insulation layer are formed on the synthetic resin layer. When the working substrate is removed, the synthetic resin layer corresponds to the base layer BL. The synthetic resin layer may be a polyimide-based resin layer, but the material is not particularly limited. The base layer BL may include a glass substrate, a metal substrate, or an organic/inorganic composite material substrate, etc.

The circuit element layer DP-CL includes at least one insulation layer and a circuit element. Hereinafter, the insulation layer included in the circuit element layer DP-CL is referred to as an intermediate insulation layer. The intermediate insulation layer includes at least one intermediate inorganic film and/or at least one intermediate organic film. The circuit element includes signal lines and a driving circuit of a pixel, etc. The circuit element layer DP-CL may be formed through a process of forming an insulation layer, a semiconductor layer and a conduction layer by coating and deposition, etc., a photolithography process for the insulation layer, and a patterning process for the semiconductor layer and the conduction layer.

The display element layer DP-OLED includes a light emitting element. The display element layer DP-OLED may include an organic light emitting diode as the light emitting element or other known element. The display element layer DP-OLED includes, for example, an organic material as a pixel definition layer.

As to be described later, the upper insulation layer TFL may include a thin film encapsulation layer configured to encapsulate the circuit element layer DP-CL. The upper insulation layer TFL may further include functional layers such as a capping layer, a reflection prevention layer or a refractive index adjusting layer, etc.

As illustrated in FIG. 8B, the display panel DP includes the display area DP-DA and the non-display area DP-NDA on a plane. In the illustrated embodiment, the non-display area DP-NDA may be defined along an edge of the display area DP-DA. The display area DD-DA and the non-display area DP-NDA of the display panel DP respectively correspond to the display area DD-DA and the non-display area DD-NDA of the display device DD illustrated in FIGS. 1A to 2B.

The display panel DP may include a driving circuit GDC, a plurality number of signal lines SGL (hereinafter, signal lines) and a plurality of pixels PX (hereinafter, pixels). The pixels PX are disposed in the display area DP-DA. Each of the pixels PX includes a light emitting element and a pixel driving circuit connected thereto. The driving circuit GDC, the signal lines SGL, and the pixel driving circuit may be included in the circuit element layer DP-CL illustrated in FIG. 3A.

The driving circuit GDC may include a scanning driving circuit. The scanning driving circuit generates a plurality of scanning signals (hereinafter, scanning signals), and sequentially outputs the scanning signals to a plurality of scanning lines GL (hereinafter, ici scanning lines) to be described later. The scanning driving circuit may further output another control signal to the driving circuit of the pixels PX.

The scan driving unit may include a plurality of thin-film transistors formed through a process identical to that of the driving circuit of the pixels PX, for example, a Low Temperature Polycrystalline Silicon (LTPS) process or a Low Temperature Polycrystalline Oxide (LTPO) process.

The signal lines SGL include the scanning lines GL, data lines DL, a power supply line PL and a control signal line CSL. The scanning lines GL are respectively connected to corresponding pixels PX from among the pixels PX, and the data lines DL are respectively connected to corresponding pixels PX from among the pixels PX. The power supply line PL is connected to the pixels PX. The control signal line CSL may provide control signals to the scanning driving circuit.

The signal lines SGL may be connected to a circuit board not illustrated. And the signal lines SGL may be connected to a timing control circuit of an integrated chip type mounted on the circuit board. In the illustrated embodiment of the invention, such an integrated chip may be disposed in the non-display area DP-NDA to be connected to the signal lines SGL.

As shown in FIG. 8C, the circuit element layer DP-CL may include a buffer layer BFL that is an inorganic layer, a first intermediate inorganic layer 10 and a second intermediate inorganic layer 20, and an intermediate organic layer 30 that is an organic layer. FIG. 8C exemplarily illustrates disposition relationships among a first semiconductor pattern OSP1 that composes a switching transistor T1 and a driving transistor T2, a second semiconductor pattern OSP2, a first control electrode GE1, a second control electrode GE2, a first input electrode DE1, a first output electrode SE1, a second input electrode DE2, and a second output electrode SE2. First to fourth through holes CH1 to CH4 are also exemplarily illustrated.

The display element layer DP-OLED includes a light emitting element. The display element layer DP-OLED may include an organic light emitting diode OLED as the light emitting element or other known element. The display element layer DP-OLED includes a pixel definition layer. For example, the pixel definition layer may be an organic layer.

A first electrode AE is disposed on the intermediate organic layer 30. The first electrode AE is connected to the second output electrode SE2 through a fifth through hole CH5 penetrating through the intermediate organic layer 30. An opening part OP is defined in the pixel definition layer PDL. The opening part OP of the pixel definition layer PDL exposes at least a part of the first electrode AE. The opening part OP of the pixel definition layer PDL is named as a light emission opening part in order to be distinguished from other opening parts.

The pixel panel DP may include a light emission area PXA and a non-light emission area NPXA adjacent to the light emission area PXA. The non-light emission area NPXA may surround the light emission area PXA. The light emission area PXA in the illustrated embodiment is defined to correspond to a part of the first electrode AE exposed by the light emission opening part OP.

A hole control layer HCL may be commonly disposed on the light emission area PXA and the non-light emission area NPXA. The hole control layer HCL may include a hole transport layer, and further include a hole injection layer. A light emission layer EML is disposed on the hole control layer HCL. The light emission layer EML may be disposed on an area corresponding to the light emission opening part OP. In other words, the light emission layer EML may be separately formed in each of the plurality of pixels. The light emission layer EML may include an organic material and/or an inorganic material. The light emission layer EML may generate prescribed colored light.

An electron control layer ECL is disposed on the light emission layer EML. An electron control layer ECL may include a hole transport layer, and further include a hole injection layer. The hole control layer HCL and the electron control layer ECL may be commonly formed in a plurality of pixels using an open mask. The second electrode CE is disposed on the electron control layer ECL. The second electrode CE is commonly disposed in the plurality of pixels PX.

The upper insulation layer TFL is disposed on the second electrode CE. The upper insulation layer TFL may include a plurality of thin films (hereinafter, first thin films). As in the illustrated embodiment, the plurality of thin films may include a thin film encapsulation layer and a capping layer that are functionally distinguished from each other. The thin film encapsulation layer TFE may include an inorganic layer/an organic layer/an inorganic layer. A refractive index adjustment layer may be further disposed between the second electrode CE and the thin film encapsulation layer TFE, and may include the same material as the organic material of the organic light emitting diode OLED.

Figure 9A:
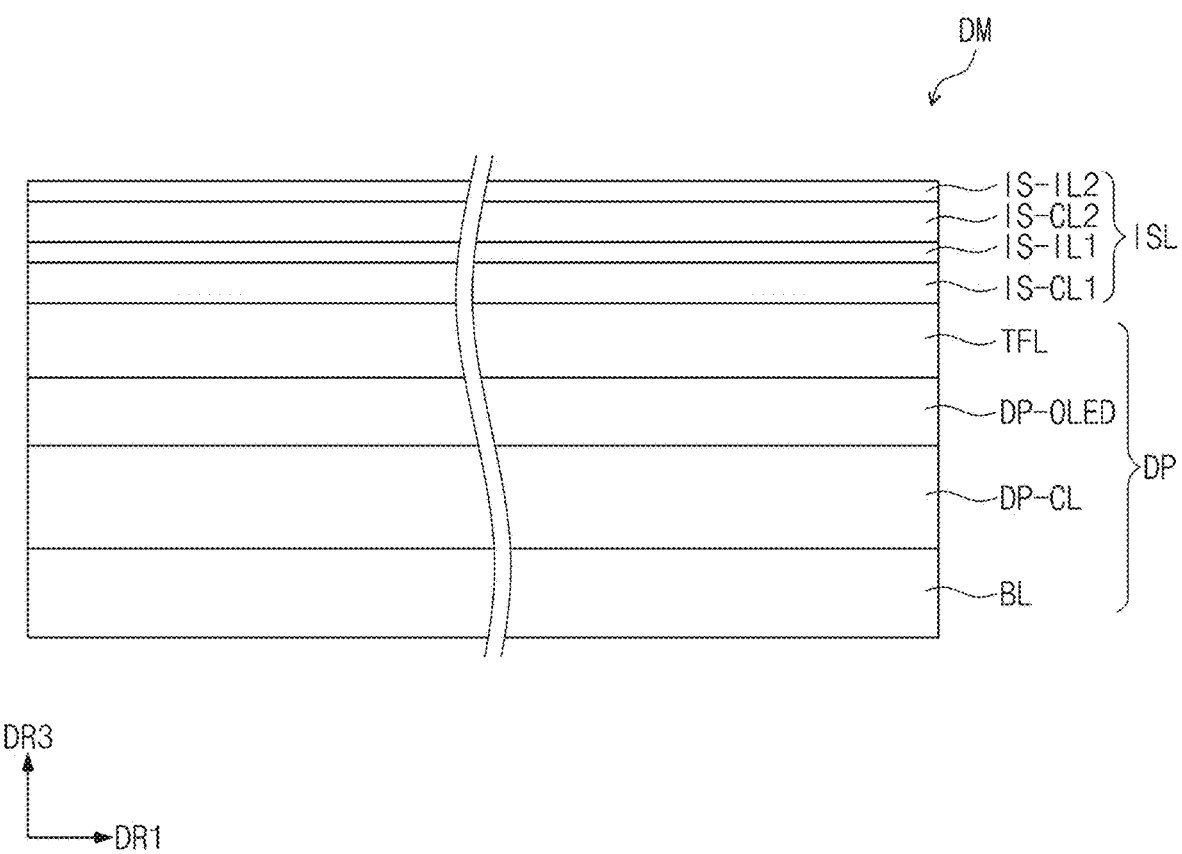
FIG. 9A is a cross-sectional view of a display device constructed according to an exemplary embodiment of the invention.
Figure 9B:
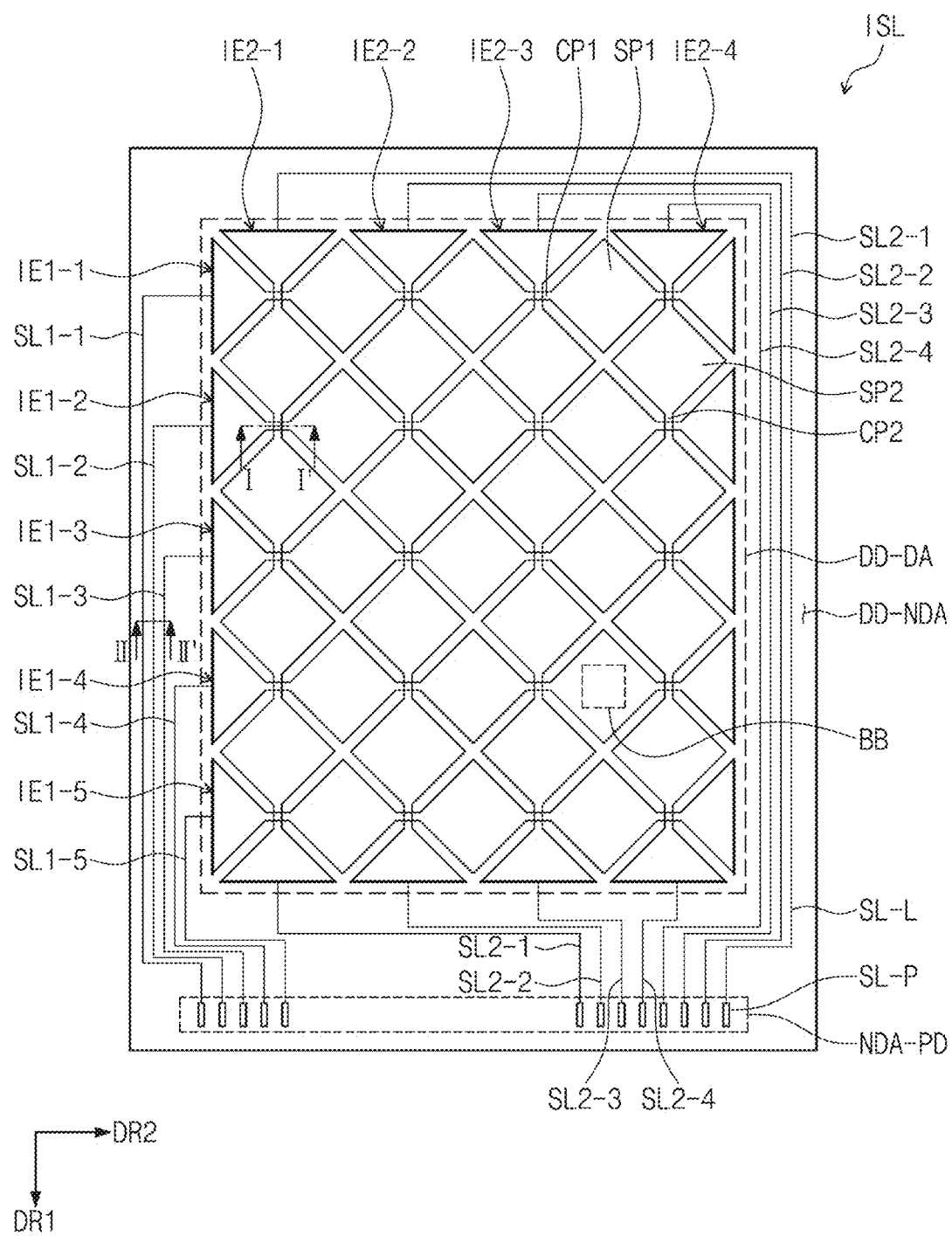
FIG. 9B is a plan view of an input sensing layer constructed according to an exemplary embodiment of the invention.
Figure 9C:
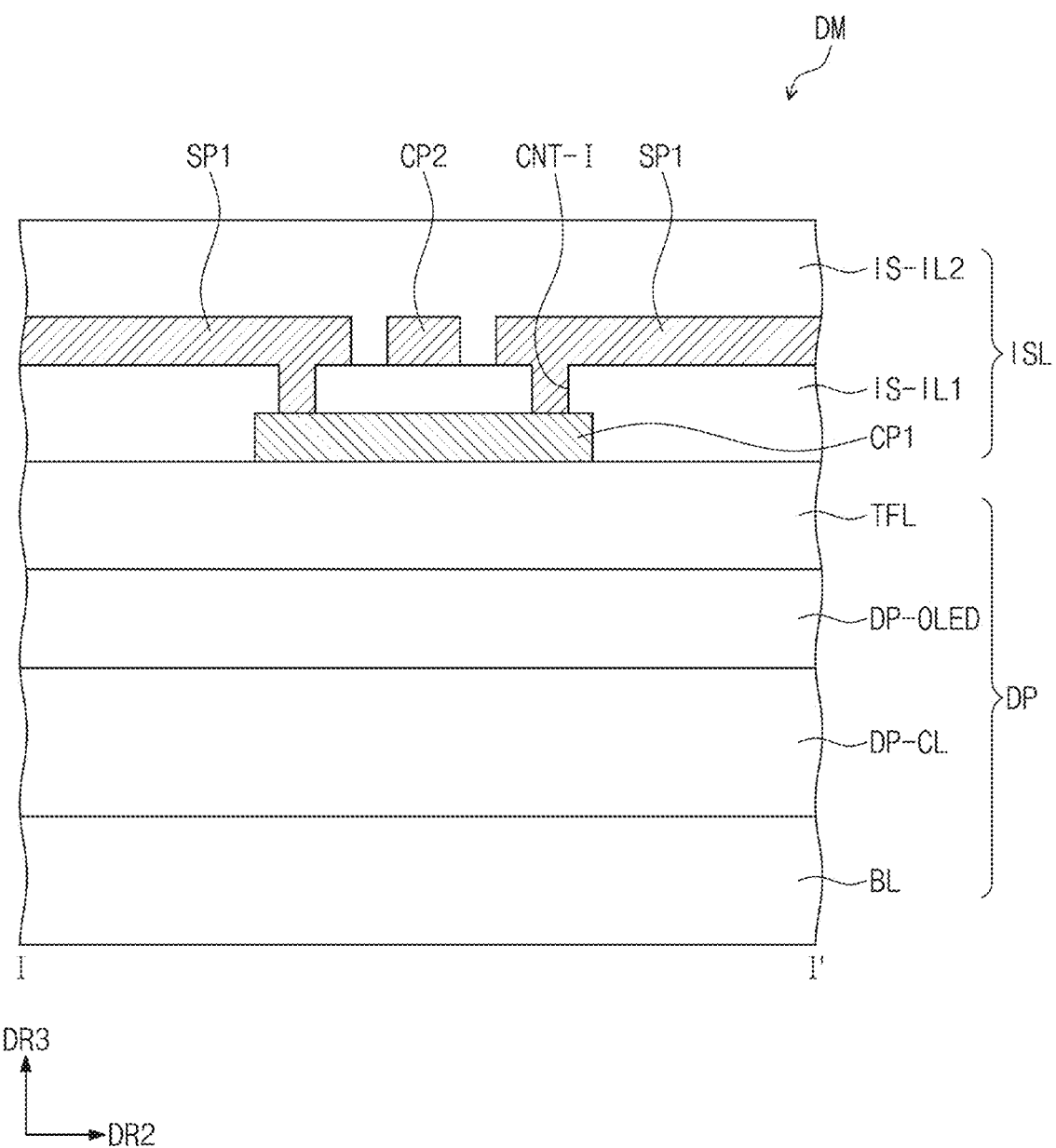
FIG. 9C is a cross-sectional view of at least a part of the input sensing layer of FIG. 9B.
Figure 9D:
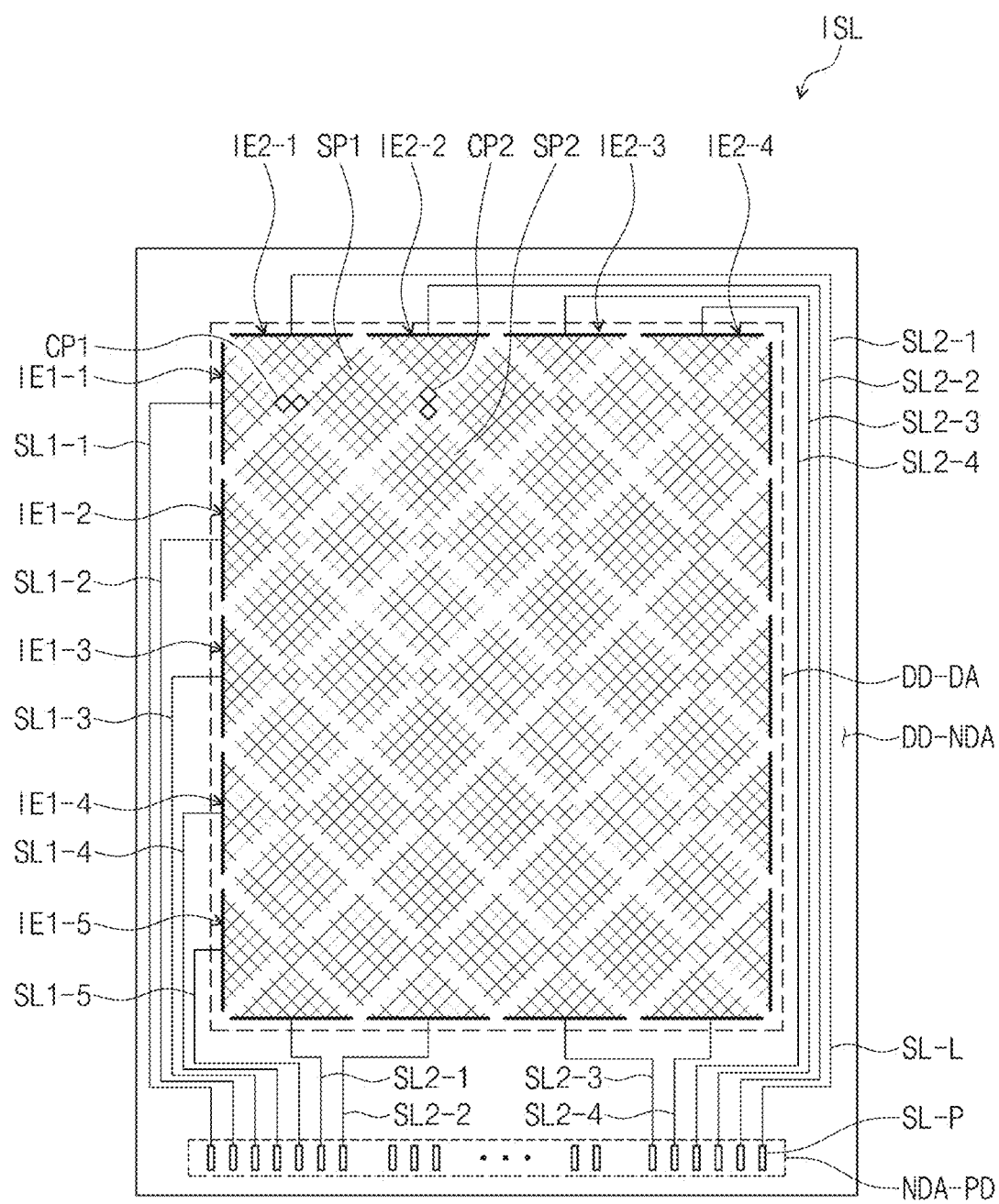
FIG. 9D is a plan view of the at least a part of the input sensing layer of FIG. 9B.

FIG. 9A is a cross-sectional view of the display device DD constructed according to an exemplary embodiment of the invention. FIG. 9B is a plan view of the input sensing layer ISL constructed according to an exemplary embodiment of the invention. FIG. 9C is a cross-sectional view of an area BB of the input sensing layer ISL according to an exemplary embodiment of the invention. FIG. 9D is a plan view of the area BB of the input sensing layer ISL according to an exemplary embodiment of the invention.

FIG. 9A simply illustrates the display panel DP and the reflection prevention layer RPL in order to explain the laminate relationship of the input sensing layer ISL. The input sensing layer ISL includes at least a sensing electrode. The input sensing layer ISL may further include a signal line connected to the sensing electrode and at least one insulation layer (or a second thin film). The input sensing layer ISL may sense an external input in, for example, a capacitive manner. The operation of the input sensing layer ISL is not particularly limited, and the input sensing layer ISL in an exemplary embodiment of the invention may sense an external input in an electromagnetic inductive manner or a pressure sensing manner.

As illustrated in FIG. 9A, the input sensing layer ISL may include a first conductive layer IS-CL1, a first insulation layer IS-IL1, a second conductive layer IS-CL2, and a second insulation layer IS-IL2. Each of the first conductive layer IS_CL1 and the second conductive layer IS-CL2 may have a single-layered structure or have a multi-layered structure laminated along a third directional axis DR3. The conductive layer of the single-layered structure may include a metal layer or a transparent conductive layer. The metal layer may include molybdenum, silver, titanium, copper, aluminum, and an alloy thereof. The transparent conductive layer may include a transparent conductive oxide such as indium tin oxide (ITO), indium zinc oxide (IZO), zinc oxide ZnO, or indium tin zinc oxide (ITZO). Besides, the transparent conductive layer may include a conductive polymer such as PEDOT, a metal nano-wire, or graphene.

The conductive layer of the multi-layered structure may include multi-metal-layers. For example, the multi-metal-layers may have a three-layered structure of titanium/aluminum/titanium. The conductive layer of the multi-layered structure may include at least one metal layer and at least one transparent conductive layer.

Each of the first conductive layer IS-CL1 and the second conductive layer IS-CP2 includes a plurality of patterns. Hereinafter, descriptions will be provided about that the first conductive layer IS-CL1 includes first conductive patterns and the second conductive layer IS-CL2 includes second conductive patterns. Each of the first conductive patterns and the second conductive patterns may include sensing electrodes and signal lines.

Each of the sensing electrodes including metal layers may have a mesh shape, as to be described later, in order to prevent or suppress from being visually perceived by a user. On the other hand, the thickness of the upper insulation layer TFL may be adjusted so that a noise generated by the configuration of the display element layer DP-OLED does not affect the input sensing layer ISL. Each of the first insulation layer IS-IL1 and the second insulation layer IS-IL2 may have a single layered or multi-layered structure. Each of the first insulation layer IS-IL1 and the second insulation layer IS-IL2 may include an inorganic material, an organic material, or a composite material.

At least one of the first insulation layer IS-IL1 and the second insulation layer IS-IL2 may include an inorganic layer. The inorganic layer may include at least any one of aluminum oxide, titanium oxide, silicon oxide, silicon oxynitride, zirconium oxide, and hafnium oxide.

At least one of the first insulation layer IS-IL1 and the second insulation layer IS-IL2 may include an organic layer. The organic layer may include at least one of an acrylic based resin, a meta-acrylic based resin, polyisoprene, a vinyl based resin, an epoxy based resin, an urethane based resin, a cellulose based resin, a siloxane based resin, a polyimide based resin, a polyamide resin, and a parylene based resin.

As shown in FIG. 9B, the input sensing layer ISL may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. The input sensing layer ISL may further include optical dummy electrodes disposed in a boundary area between the first sensing electrodes IE1-1 to IE1-5 and the second sensing electrodes IE2-1 to IE2-4.

The first sensing electrodes IE1-1 to IE1-5 and the second sensing electrodes IE2-1 to IE2-4 intersect with each other. The first sensing electrodes TE1-1 to TE1-5 are arrayed in a first direction DR1, each of which has a shape extended toward a second direction DR2. The sensing electrodes may sense an external input in a mutual cap type or a self cap type. After coordinates of the mutual cap type external input are calculated during a first period, coordinates of self cap type external input may be recalculated during a second period.

Each of the first sensing electrodes IE2-1 to IE1-5 includes first sensing parts SP1 and first connection parts CP1. Each of the second sensing electrodes IE2-1 to IE2-4 includes second sensing parts SP2 and second connection parts CP2. Among the first sensing parts SP1, two first sensing parts disposed at both ends of the first electrode may have the smaller size than the first sensor unit disposed at the center, for example, a half thereof. Among the second sensing parts SP2, two second sensing parts disposed at both ends of the second electrode may have the smaller size than the second sensor unit disposed at the center, for example, a half thereof.

FIG. 9B illustrates the first sensing electrodes IE1-1 to IE1-5 and the second sensing electrodes IE2-1 to IE2-5 according to an exemplary embodiment, but the shapes thereof are not limited. The first sensing electrodes IE1-1 to IE1-5 and the second sensing electrodes IE2-1 to IE2-5 may have a shape (e.g., a bar shape) in which a sensor unit and a connection unit are not divided. The first sensing parts SP1 and the second sensing parts SP2 having a diamond shape are exemplarily illustrated, but the shape is not limited thereto. The first sensing parts SP1 and the second sensing parts SP2 may have another polygonal shape.

Within one first sensing electrode, the first sensing parts SP1 are arrayed along the second direction DR2, and within one second sensing electrode, the second sensing parts SP2 are arrayed along the first direction DR1. Each of the first connection parts connects the adjacent first sensing parts SP1 and each of the second connection parts CP2 connects the adjacent second sensing parts SP2.

The first signal lines SL1-1 to SL1-5 are respectively connected to one ends of the first sensing electrodes IE1-1 to IE1-5. The second signal lines SL2-1 to SL2-4 are respectively connected to both ends of the second sensing electrodes IE2-1 to IE2-4. The first signal lines SL1-1 to SL1-5 may also be connected to both ends of the first sensing electrodes IE1-1 to IE1-5, respectively. The second signal lines SL2-1 to SL2-4 may be connected only to one ends of the second sensing electrodes IE2-1 to IE2-4, respectively.

According to the illustrated embodiment, sensing sensitivity may be improved in comparison to an input sensing layer ISL that includes the second signal lines SL2-1 to SL2-4 respectively connected only to one ends of the second sensing electrodes IE2-1 to IE2-4. Since the second sensing electrodes IE2-1 to IE2-4 are longer than the first sensing electrodes IE1-1 to IE1-4, a voltage drop occurs in a detection signal (or a transmission signal) and accordingly, the sensing sensitivity may be lowered. According to the illustrated embodiment, since the detection signal (or the transmission signal) is provided through the second signal lines SL2-1 to SL2-4 connected to both ends of the second sensing electrodes IE2-1 to IE2-4, the voltage drop of the detection signal (or the transmission signal) may be prevented or suppressed and thus the sensing sensitivity may be prevented or suppressed from being lowered.

The first signal lines SL1-1 to SL1-5 and the second signal lines SL2-1 to SL2-4 may include line units SL-L and pad units SL-P. The pad units SL-P may be arranged in the pad area NDA-PD.

On the other hand, in the first signal lines SL1-1 to SL1-5, the second signal lines SL2-1 to SL2-4 may be replaced by a circuit board, etc., that is separately manufactured and combined.

As shown in FIG. 9C, the first conduction layer IS-CL1 includes first connection parts CP1. The second conduction layer IS-CL2 includes first sensing parts SP1 and the second connection parts CP2. The second conduction layer IS-CL2 further includes second sensing parts SP2. Each of the second sensing electrodes IE2-1 to IE2-4 may have a one body shape. The first sensing parts SP1 are separated from the second sensing electrodes IE2-1 to IE2-4.

The conductive patterns disposed on an identical layer may be formed through an identical process, and include an identical material, and have an identical laminate structure. The lamination order of components of the input sensing layer ISL may be changed. In an exemplary embodiment of the invention, the first sensing parts SP1 and the second connection unit CP2 may be directly disposed on the upper insulation layer TFL. A first insulation layer IS-IL1, which covers the first sensing parts SP1 and the second connection unit CP2, is disposed on the upper insulation layer TFL. The first connection unit CP1 disposed on the first insulation layer IS-IL1 may be electrically connected to the first sensing parts SP1 through first connection contact holes CNT-1.

As illustrated in FIG. 9D, each of the first sensing electrodes IE1-1 to IE1-5 and the second sensing electrodes IE2-1 to IE2-4 may have a mesh shape. Since the first sensing electrodes IE1-1 to IE1-5 and the second sensing electrodes IE2-1 to IE2-4 have the mesh shapes, parasite capacitance with the second electrode CE (see FIG. 8C) may be reduced. In addition, the first sensing electrodes IE1-1 to IE1-5 and the second sensing electrodes IE2-1 to IE2-4 do not overlap the light emission area PXA, and thus are not visually perceived by the user of the display device DD.

The first sensing electrodes IE1-1 to IE1-5 and the second sensing electrodes IE2-1 to IE2-4 having the mesh shapes may include silver, aluminum, copper, chromium, nickel, titanium or the like to which a low temperature process may be applied, but the material is not limited thereto. Even when the input sensing layer ISL is provided in a continuous process, the organic light emitting diode OLED (see, FIG. 8C) may be prevented or suppressed from being damaged.

Mesh lines of the first sensing electrodes IE1-1 to IE1-5 and the second sensing electrodes IE2-1 to IE2-4 may define opening parts corresponding to the light emission area PXA.

The input sensing layer ISL of FIGS. 9A, 9B, 9C, and 9D is exemplarily explained as a capacitive type touch sensor with the structure of two conduction layers that include a first conduction layer IS-CL1 and a second conduction layer IS-CL2, but is not limited thereto. In an exemplary embodiment of the invention, the input sensing layer ISL may be a capacitive type touch sensor including the structure of one conduction layer.

The touch sensor with the structure of one conduction layer may include a plurality of sensing electrodes IE (hereinafter, sensing electrodes) and a plurality of signal lines SL (hereinafter, signal lines). The sensing electrodes have unique coordinate information. For example, the sensing electrodes may be arrayed in a matrix type and respectively connected to the signal lines. The sensing electrodes may have mesh shapes, and may be driven in a self cap type.

According to exemplary embodiments of the invention, an upper retarder is provided, which reduces the reflection ratio of external light to allow an image to be perceived at any angle, even when a user wears polarized sunglasses.

In addition, a folding part discoloration phenomenon may be prevented or suppressed by disposing optical axes of retarders in a prescribed condition as taught herein.

An upper retarder having a prescribed Young's modulus as taught herein may prevent or suppress the upper retarder from being detached despite of repetitions of folding of a display device. Therefore, durability of the foldable display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A foldable display device comprising:
a display panel;
an input sensor directly disposed on the display panel and having an upper surface;
an anti-reflector disposed on the upper surface of the input sensor, the anti-reflector comprising:
a polarizer having an upper surface and a lower surface facing the input sensor; and
at least one lower retarder disposed between the input sensor and the lower surface of the polarizer;
an upper retarder disposed on the upper surface of the polarizer such that the polarizer is interposed between the upper retarder and the at least one lower, the upper retarder having a Young's modulus of about 4 GPa to about 100 GPa and a phase retardation of about 5000 nm to about 11000 nm at about 550 nm wavelength;

a window disposed on the upper retarder and having an upper surface facing away from the upper retarder, the window having a phase retardation of about 500 nm or shorter at about 550 nm wavelength; and
at least one adhesion member disposed between the input sensor and the window,
wherein a thickness from the upper surface of the input sensor to the upper surface of the window is about 130 µm to about 540 µm.

2. The foldable display device of claim 1, wherein the upper retarder has a thickness of about 1 µm to about 80 µm.

3. The foldable display device of claim 1, wherein the at least one adhesion member has a thickness of about 5 µm to about 100 µm.

4. The foldable display device of claim 1, wherein the window has a thickness of about 30 µm to about 130 µm.

5. The foldable display device of claim 1, wherein the polarizer has a polarization axis of substantially parallel to or substantially perpendicular to a folding axis of the foldable display device.

6. The foldable display device of claim 5, wherein the lower retarder comprises:
a positive dispersion type λ/2 retarder; and
a positive dispersion type λ/4 retarder,
wherein a slow axis of the positive dispersion type λ/2 retarder and a slow axis of the positive dispersion type λ/4 retarder are defined on an identical quadrant by the folding axis and a reference axis perpendicular to the folding axis.

7. The foldable display device of claim 6, wherein an angle between a slow axis of the upper retarder and the polarization axis of the polarizer is about 10 degrees to 75 degrees.

8. The foldable display device of claim 5, wherein the lower retarder comprises a negative dispersion type λ/4 retarder, and a slow axis of the lower retarder forms an angel of about 45 degrees with the polarization axis of the polarizer.

9. The foldable display device of claim 5, wherein the window comprises a base layer having a phase retardation of about 0 nm to about 500 nm at about 550 nm wavelength.

10. The foldable display device of claim 1, wherein the polarizer has a polarization axis that forms an angle of about 45 degrees with respect to a folding axis of the foldable display device, and
wherein the lower retarder comprises a negative dispersion type λ/4 retarder.

11. The foldable display device of claim 10, wherein the window comprises a base layer having a phase retardation of about 500 nm or shorter at about 550 nm wavelength.

12. The foldable display device of claim 1, wherein each of the upper retarder and the lower retarder comprises a base layer and a liquid crystal layer aligned on one surface of the base layer.

13. The foldable display device of claim 1, wherein
the display panel comprises light emitting elements and a plurality of first thin films covering the light emitting elements, and
the input sensor comprises conductive patterns disposed on the plurality of thin films and at least one second thin film disposed on the conductive patterns.

14. The foldable display device of claim 13, wherein at least a part of the conductive patterns has a mesh shape.

15. A foldable display device comprising:
a display module having a display panel and an input sensor directly disposed on the display panel;
a first adhesion member connected to the display module;
an anti-reflector connected to the first adhesion member;
a second adhesion member connected to the anti-reflector;
an upper retarder connected to the second adhesion member, the upper retarder having a Young's modulus of about 4 GPa to about 100 GPa and a phase retardation of about 5000 nm to about 11000 nm at about 550 nm wavelength;
a third adhesion member directly connected to the upper retarder; and
a window connected to the third adhesion member, the window having a phase retardation of about 0 nm to about 500 nm at about 550 nm wavelength,
wherein the anti-reflector comprises:
a polarizer disposed between the second adhesion member and the first adhesion member; and
a positive dispersion type λ/2 retarder and a positive dispersion type λ/4 retarder disposed between the polarizer and the first adhesion member, and
wherein a total thickness of the first adhesion member, the anti-reflector the second adhesion member, the upper retarder, the third adhesion member, and the window is about 130 µm to about 540 µm.

16. The foldable display device of claim 15, wherein the polarizer has a polarization axis substantially parallel to or substantially perpendicular to a folding axis of the foldable display device.

17. A foldable display device comprising:
a display module having a display panel and an input sensor directly disposed on the display panel;
a first adhesion member coupled to the display module, the first adhesion member having a lower surface facing the display module;
an anti-reflector coupled to the first adhesion member;
a second adhesion member coupled to the anti-reflector;
an upper retarder coupled to the second adhesion member, the upper retarder having a Young's modulus of about 4 GPa to about 100 GPa and a phase retardation of about 5000 nm to about 11000 nm at about 550 nm wavelength;
a third adhesion member directly coupled to the upper retarder; and
a window coupled to the third adhesion member, the window having a phase retardation of about 0 nm to about 500 nm at about 550 nm wavelength and having an upper surface facing away from the upper retarder,
wherein the anti-reflector comprises:
a polarizer disposed between the second adhesion member and the first adhesion member; and
a negative dispersion type λ/4 retarder disposed between the polarizer and the first adhesion member,
wherein a thickness from the lower surface of the first adhesion member to the upper surface of the window is about 130 µm to about 540 µm.

18. The foldable display device of claim 17, wherein a polarization axis of the polarizer is substantially parallel to or substantially perpendicular to a folding axis of the foldable display device, or form an angle of about 45 degrees with the folding axis of the foldable display device.

19. The foldable display device of claim 17, wherein the window comprises a base layer, the base layer has a phase retardation of about 500 nm or shorter at about 550 nm wavelength.

* * * * *